United States Patent
Ohchi

(10) Patent No.: US 9,379,160 B2
(45) Date of Patent: Jun. 28, 2016

(54) SOLID-STATE IMAGING APPARATUS, METHOD OF MANUFACTURING THE SAME, AND ELECTRONIC APPARATUS

(71) Applicant: Sony Corporation, Tokyo (JP)

(72) Inventor: Tomokazu Ohchi, Kumamoto (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/323,510

(22) Filed: Jul. 3, 2014

(65) Prior Publication Data

US 2015/0014750 A1 Jan. 15, 2015

(30) Foreign Application Priority Data

Jul. 10, 2013 (JP) ................................. 2013-144503

(51) Int. Cl.
| | |
|---|---|
| H01L 31/105 | (2006.01) |
| H01L 31/062 | (2012.01) |
| H01L 31/18 | (2006.01) |
| H01L 27/146 | (2006.01) |
| H01L 27/148 | (2006.01) |

(52) U.S. Cl.
CPC .... *H01L 27/14689* (2013.01); *H01L 27/14614* (2013.01); *H01L 27/14656* (2013.01); *H01L 27/14843* (2013.01); *H01L 27/148* (2013.01); *H01L 27/1462* (2013.01)

(58) Field of Classification Search
USPC ............ 257/79, 225, 432, 436, 458, E31.039, 257/E31.061, E21.13, E27.132, E27.133, 257/E27.151, E27.152, E33.059, E33.061; 438/22, 24, 57, 75; 136/250
See application file for complete search history.

(56) References Cited

U.S. PATENT DOCUMENTS

| | | | | |
|---|---|---|---|---|
| 5,119,156 A | * | 6/1992 | Kawahara et al. ............ 257/432 |
| 5,693,967 A | * | 12/1997 | Park .................. H01L 27/14627 |
| | | | | 257/223 |
| 5,785,768 A | * | 7/1998 | Nakata ..................... C25B 1/003 |
| | | | | 136/250 |
| 7,456,452 B2 | * | 11/2008 | Wells et al. .................... 257/292 |
| 7,709,914 B2 | * | 5/2010 | Lee .................... H01L 27/14636 |
| | | | | 257/294 |
| 7,986,022 B2 | * | 7/2011 | Cheng ................... H01L 29/732 |
| | | | | 257/458 |
| 2001/0042864 A1 | * | 11/2001 | Kato ............................... 257/79 |
| 2005/0040440 A1 | * | 2/2005 | Murakami .................... 257/225 |

FOREIGN PATENT DOCUMENTS

| | | |
|---|---|---|
| JP | 03-285335 A | 12/1991 |
| JP | 08-139304 A | 5/1996 |
| JP | 08-288492 A | 11/1996 |
| JP | 2011-249690 A | 12/2011 |

* cited by examiner

*Primary Examiner* — Dao H Nguyen
(74) *Attorney, Agent, or Firm* — Sheridan Ross P.C.

(57) ABSTRACT

A solid-state imaging apparatus includes a semiconductor substrate in which a charge transfer section configured to transfer a charge generated in a photoelectric conversion section is formed. The semiconductor substrate includes a surface that is formed in a convex shape in an area in which the charge transfer section is formed.

16 Claims, 18 Drawing Sheets

Transfer direction →

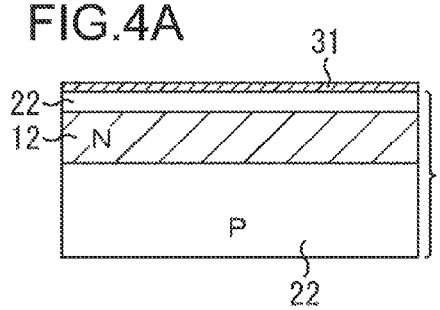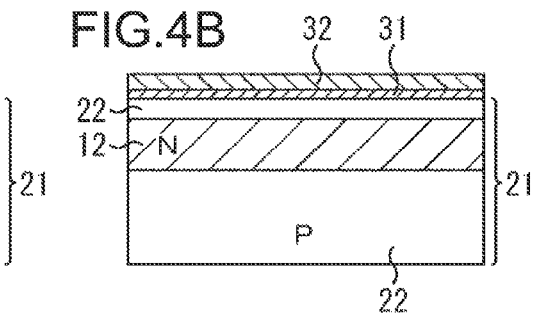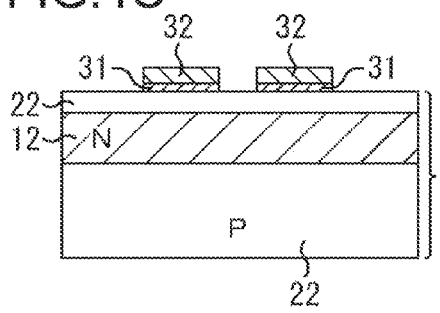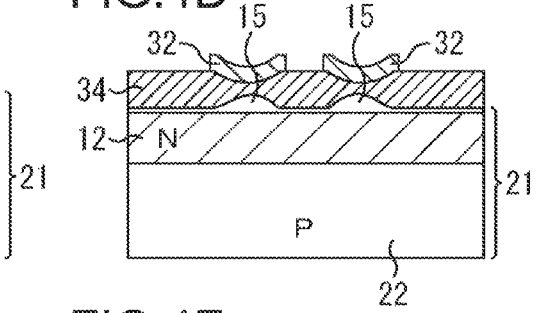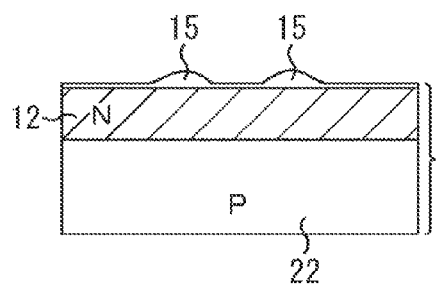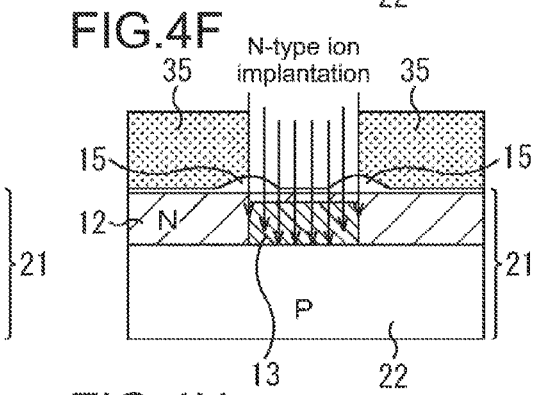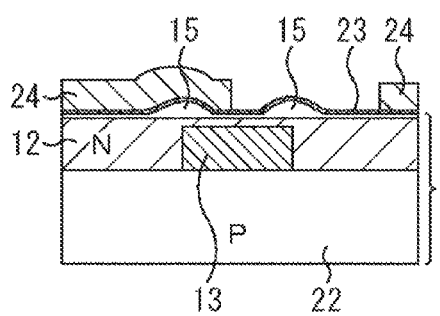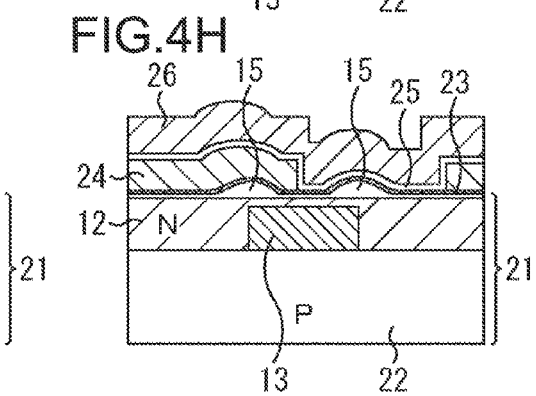

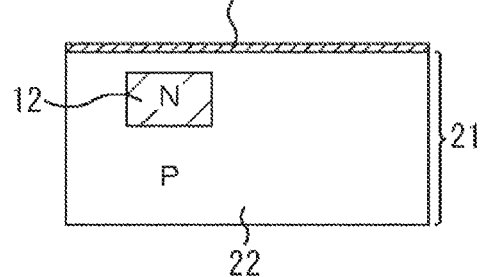
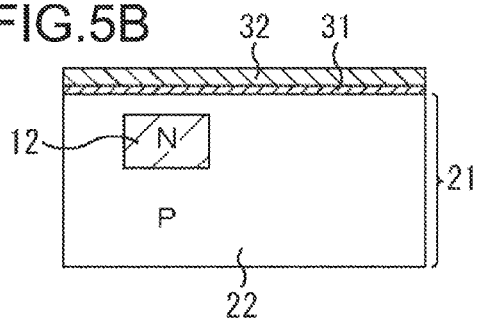
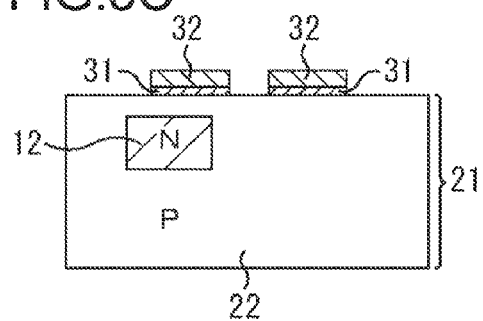
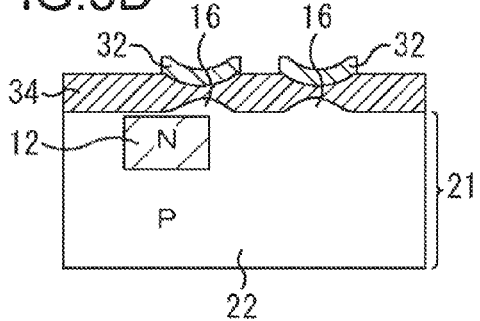
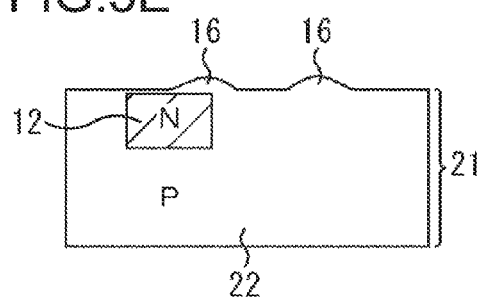
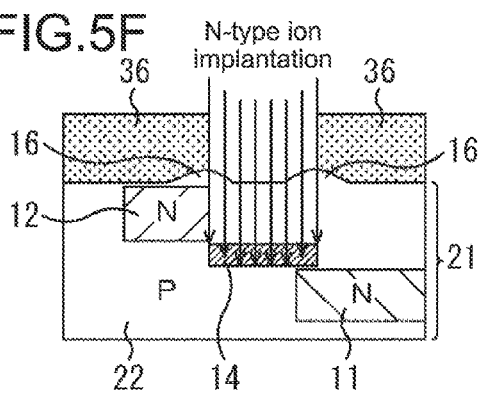
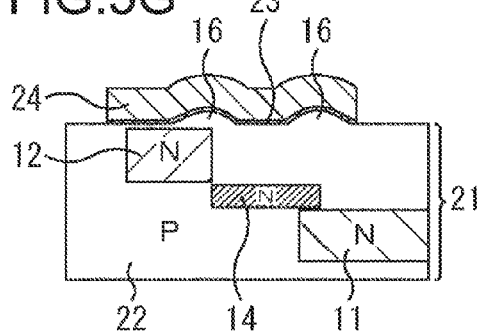
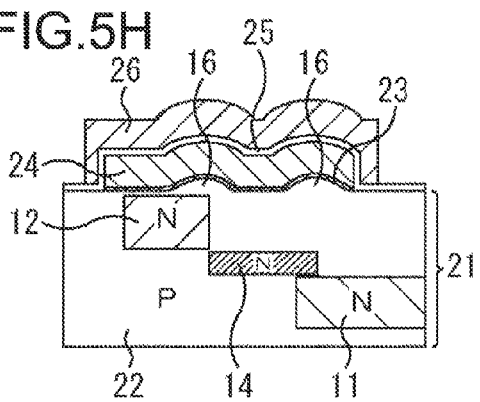

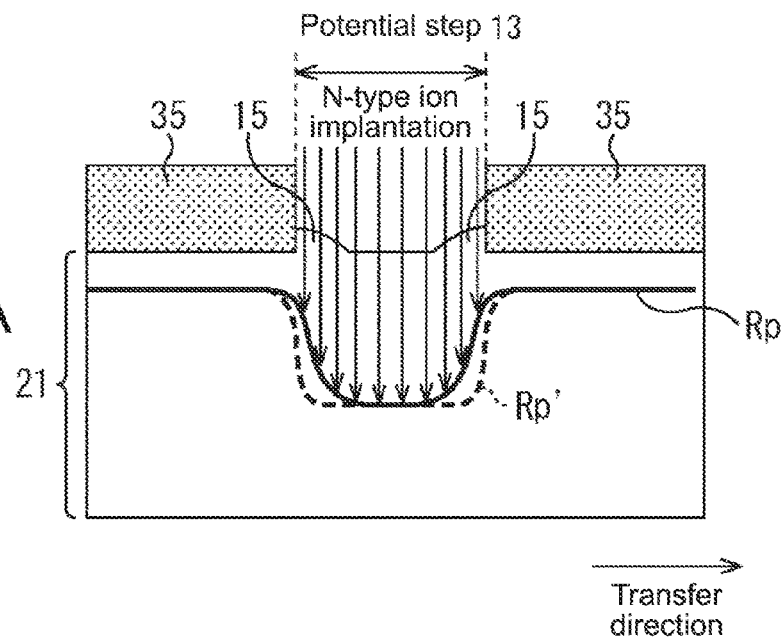
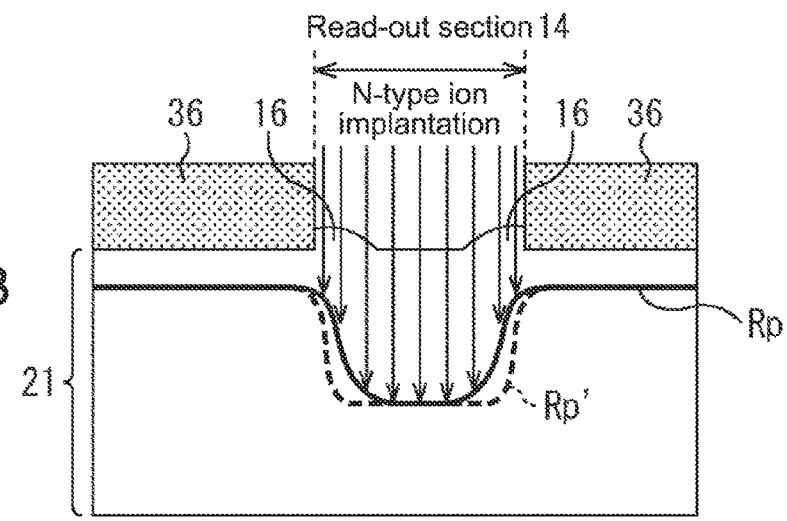

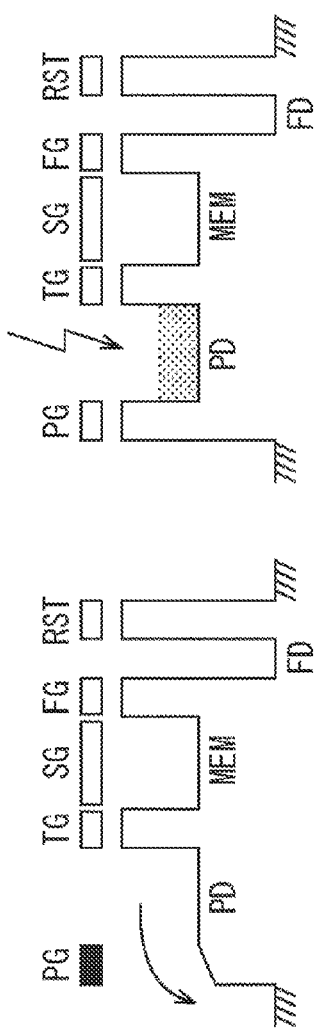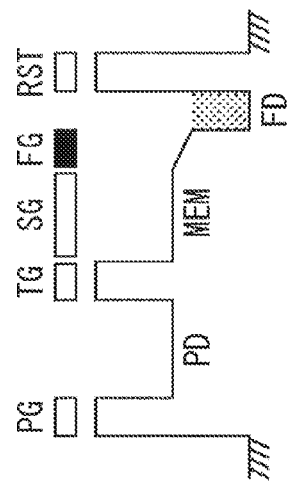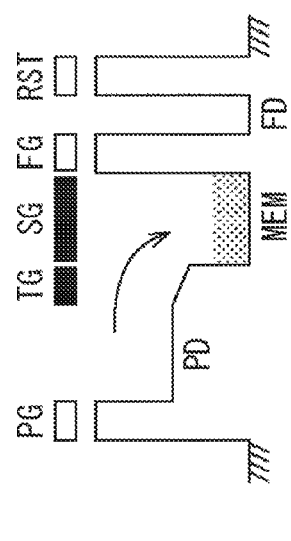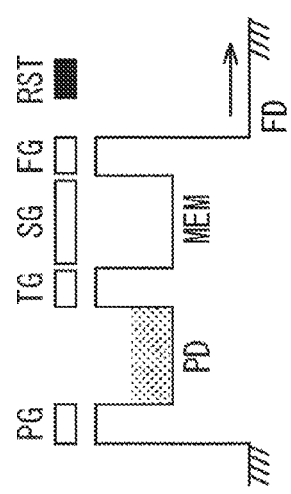

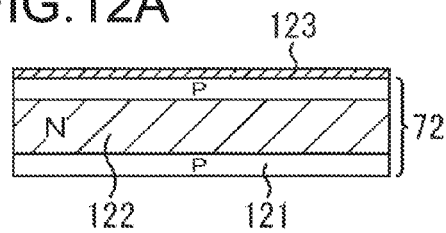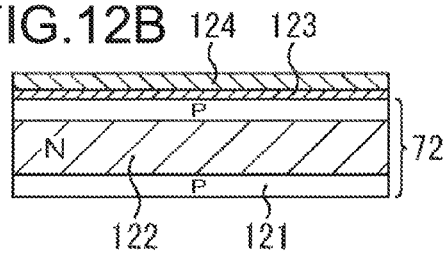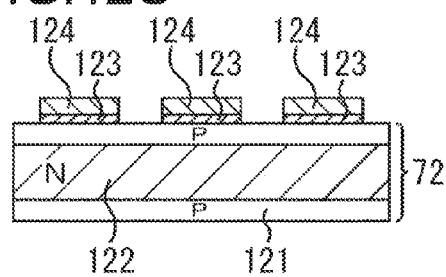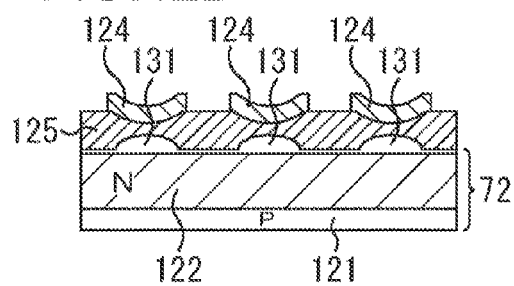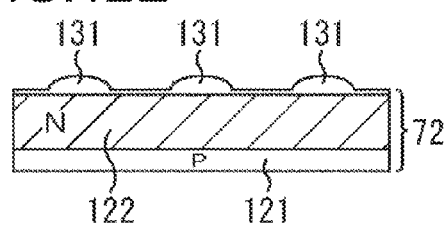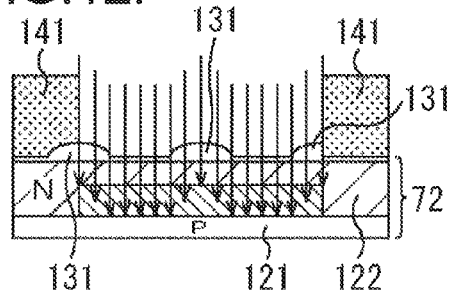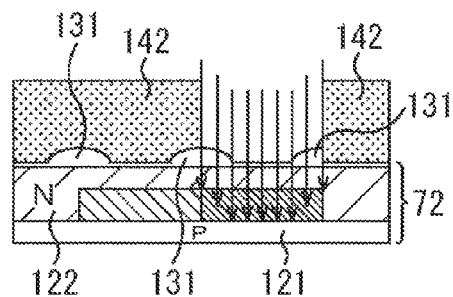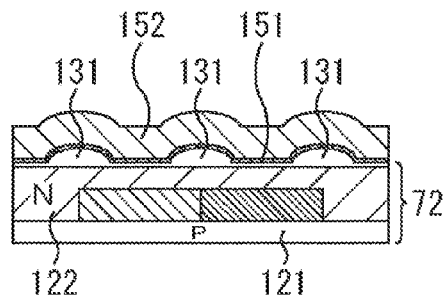

SOLID-STATE IMAGING APPARATUS, METHOD OF MANUFACTURING THE SAME, AND ELECTRONIC APPARATUS

CROSS REFERENCE TO RELATED APPLICATIONS

This application claims the benefit of Japanese Priority Patent Application JP 2013-144503 filed Jul. 10, 2013, the entire contents of which are incorporated herein by reference.

BACKGROUND

The present disclosure relates to a solid-state imaging apparatus, a method of manufacturing the same, and an electronic apparatus and more particularly to a solid-state imaging apparatus, a method of manufacturing the same, and an electronic apparatus that can improve the charge transfer efficiency.

A charge coupled device (CCD) solid-state imaging apparatus includes a vertical CCD and a horizontal CCD that are transfer channels for transferring charges collected by a photodiode to an output amplifier.

A vertical transfer register constituted of the vertical CCD transfers charges in a vertical direction when a clock voltage is applied to a gate electrode provided in an upper portion thereof.

Regarding a method of forming the vertical transfer register, there are a surficial channel and a buried channel. The surficial channel has a problem in that, due to Si defects in the surface, electrons are easily captured or electrons not associated with signals are easily generated, which deteriorates the transfer efficiency. Therefore, in general, the buried channel is often employed in the CCD solid-state imaging apparatus. With the buried channel, the channel is formed slightly deep under the surface to transfer electrons.

A method of forming the buried channel will be simply described. First, only areas in which vertical transfer registers are to be formed are opened with a resist mask and N-type ions such as As (arsenic) are implanted, such that N-type transfer channels are formed. Next, an N-type ion implantation using As or the like is further performed on partial areas of the formed N-type transfer channels, such that potential steps in which the potential is set deeper is formed. This potential steps have an effect of assisting in transferring charges.

The potential step is formed by opening only a desired area with a resist mask and performing an ion implantation as described above. Thus, the potential sharply changes at a boundary between the area subjected to the ion implantation and the area not subjected to the ion implantation. Due to such a sharp change in potential, there is a fear that some charges remain when charges are transferred in the vertical direction. The remaining charges directly lead to the deterioration of imager characteristics, which is unfavorable. In view of this, various techniques for improving the charge transfer efficiency have been proposed (e.g., see Japanese Patent Application Laid-open No. 2011-249690, Japanese Patent Application Laid-open No. HEI 08-288492, Japanese Patent Application Laid-open No. HEI 03-285335, and Japanese Patent Application Laid-open No. HEI 08-139304).

SUMMARY

It is desirable to further improve the charge transfer efficiency.

The present disclosure has been made in view of the above-mentioned circumstances, by which it is possible to improve the charge transfer efficiency.

According to a first embodiment of the present disclosure, there is provided a solid-state imaging apparatus including a semiconductor substrate in which a charge transfer section configured to transfer a charge generated in a photoelectric conversion section is formed, the semiconductor substrate including a surface that is formed in a convex shape in an area in which the charge transfer section is formed.

According to a second embodiment of the present disclosure, there is provided a method of manufacturing a solid-state imaging apparatus including: forming a surface of a semiconductor substrate in a convex shape by a LOCOS (local oxidation of silicon) method; and subjecting a resist mask to patterning and performing an ion implantation such that a boundary of the resist mask corresponds to a top of the convex shape, to thereby form a charge transfer section in the semiconductor substrate.

According to a third embodiment of the present disclosure, there is provided an electronic apparatus including a solid-state imaging apparatus, including a semiconductor substrate in which a charge transfer section configured to transfer a charge generated in a photoelectric conversion section is formed, the semiconductor substrate including a surface that is formed in a convex shape in an area in which the charge transfer section is formed.

In the first to third embodiments of the present disclosure, the charge transfer section configured to transfer the charge generated in the photoelectric conversion section is provided in the semiconductor substrate and the surface of the semiconductor substrate is formed in the convex shape in the area in which the charge transfer section is formed.

The solid-state imaging apparatus and the electronic apparatus may be independent apparatuses or may be modules incorporated in other apparatuses.

According to the first to third embodiments of the present disclosure, it is possible to improve the charge transfer efficiency.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 4A to 4H are views explaining a method of forming a cross-sectional configuration in a vertical direction;

FIGS. 5A to 5H are views explaining a method of forming a cross-sectional configuration in a horizontal direction;

FIGS. 6A and 6B are views explaining potentials Rp of a potential step and a read-out section;

FIGS. 9A to 9E are views explaining an operation of the pixel shown in FIG. 8;

FIGS. 12A to 12H are views explaining a method of forming the charge accumulation section;

DETAILED DESCRIPTION OF EMBODIMENTS

Hereinafter, embodiments for carrying out the present disclosure (hereinafter, referred to as embodiments) will be described. Note that the descriptions will be made in the following order.
1. First Embodiment (Configuration Example of CCD Solid-State Imaging Apparatus)
2. Second Embodiment (Configuration Example of CMOS Solid-State Imaging Apparatus)
3. Third Embodiment (Application Example to Electronic Apparatus)
<1. First Embodiment>
<Schematic Configuration of CCD Solid-State Imaging Apparatus>

Figure 1:
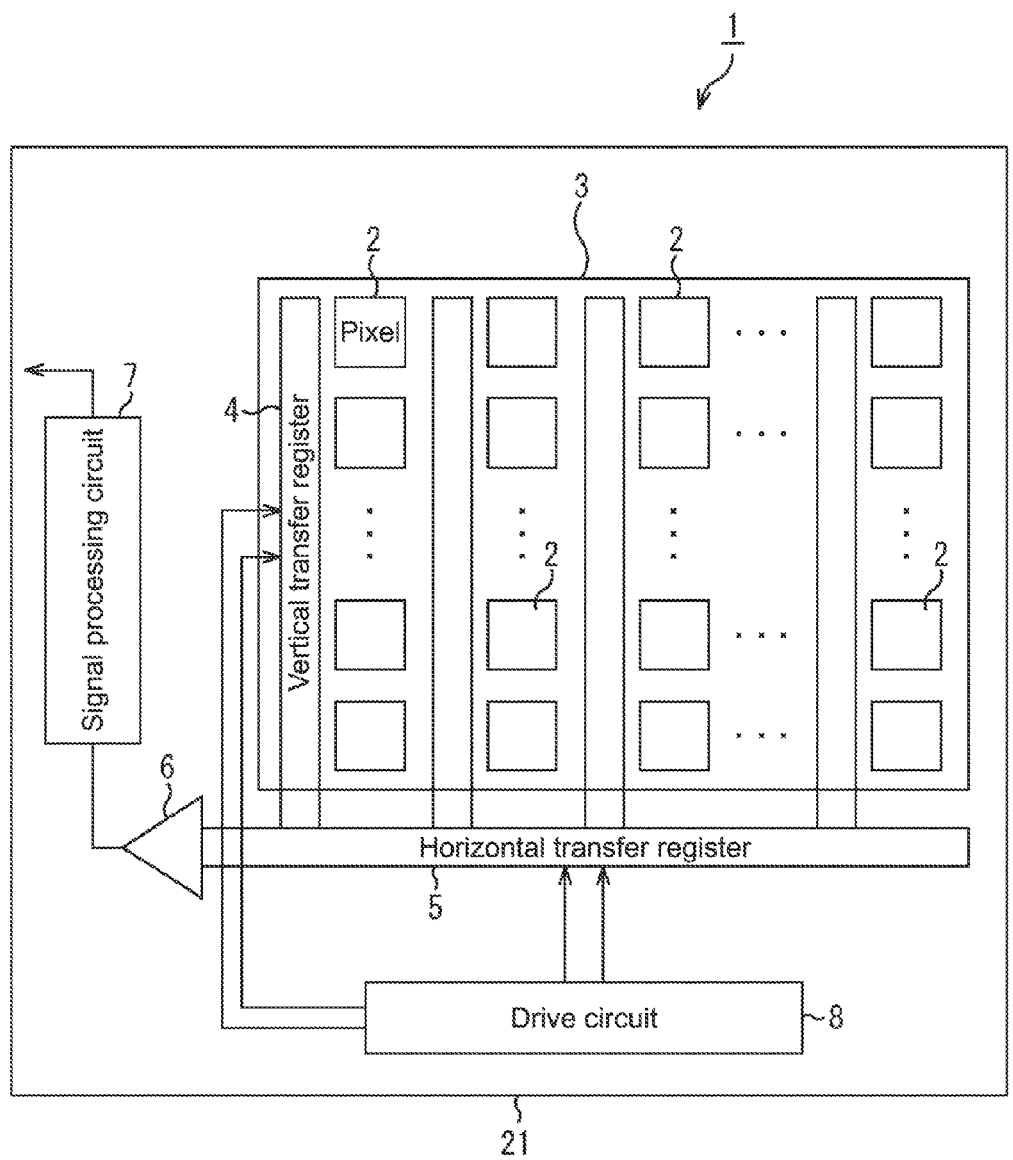
FIG. 1 is a view showing a schematic configuration of a CCD solid-state imaging apparatus according to a first embodiment of the present disclosure.

FIG. 1 is a view showing a schematic configuration of a CCD solid-state imaging apparatus according to a first embodiment of the present disclosure.

A CCD solid-state imaging apparatus 1 of FIG. 1 includes a pixel array section 3 in which a plurality of pixels 2 are two-dimensionally arranged in a matrix form on a semiconductor substrate 21 using silicon (Si), for example, as a semiconductor.

Each of the pixels 2 two-dimensionally arranged includes a photodiode as a photoelectric conversion element that performs a photoelectric conversion, and converts incident light into signal charges depending on the amount of received light and accumulates the signal charges. Further, each of the pixels 2 includes a plurality of pixel transistors for reading out signal charges accumulated in the photodiode. The plurality of pixel transistors include, for example, a charge read-out transistor, a reset transistor, an amplifying transistor, and a selection transistor.

In the pixel array section 3, vertical transfer registers 4 are provided adjacent to the plurality of pixels 2 arranged in a column direction for each pixel column. Each of the plurality of vertical transfer registers 4 serves to transfer signal charges, which have been read out from the pixels 2 in each row, in the vertical direction, and is constituted of a vertical CCD.

A horizontal transfer register 5 is provided at ends of the vertical transfer registers 4 to extend in a horizontal direction. The horizontal transfer register 5 serves to transfer signal charges, which have been transferred by the vertical transfer registers 4 in the vertical direction, in the horizontal direction, and is constituted of a horizontal CCD. An output amplifier 6 is provided at a destination of signal charges transferred by the horizontal transfer register 5.

The output amplifier 6 converts signal charges, which have been transferred by the horizontal transfer register 5 in the horizontal direction, into a voltage and outputs the voltage as a signal. The signal output from the output amplifier 6 is input into a signal processing circuit 7. The signal processing circuit 7 receives the signal output from the output amplifier 6 and subjects the signal to preset signal processing to generate a predetermined image signal. The generated image signal is output to an external device of the CCD solid-state imaging apparatus 1.

The drive circuit 8 generates a transfer pulse for transferring signal charges. At the same time, the drive circuit 8 controls the vertical transfer register 4 and the horizontal transfer register 5 to be driven according to this transfer pulse. At this time, the drive circuit 8 provides the vertical transfer register 4 with a vertical transfer pulse and the horizontal transfer register 5 with a horizontal transfer pulse.

The CCD solid-state imaging apparatus 1 has a schematic configuration as described above.
<Top View of Pixel Array Section>

Figure 2:
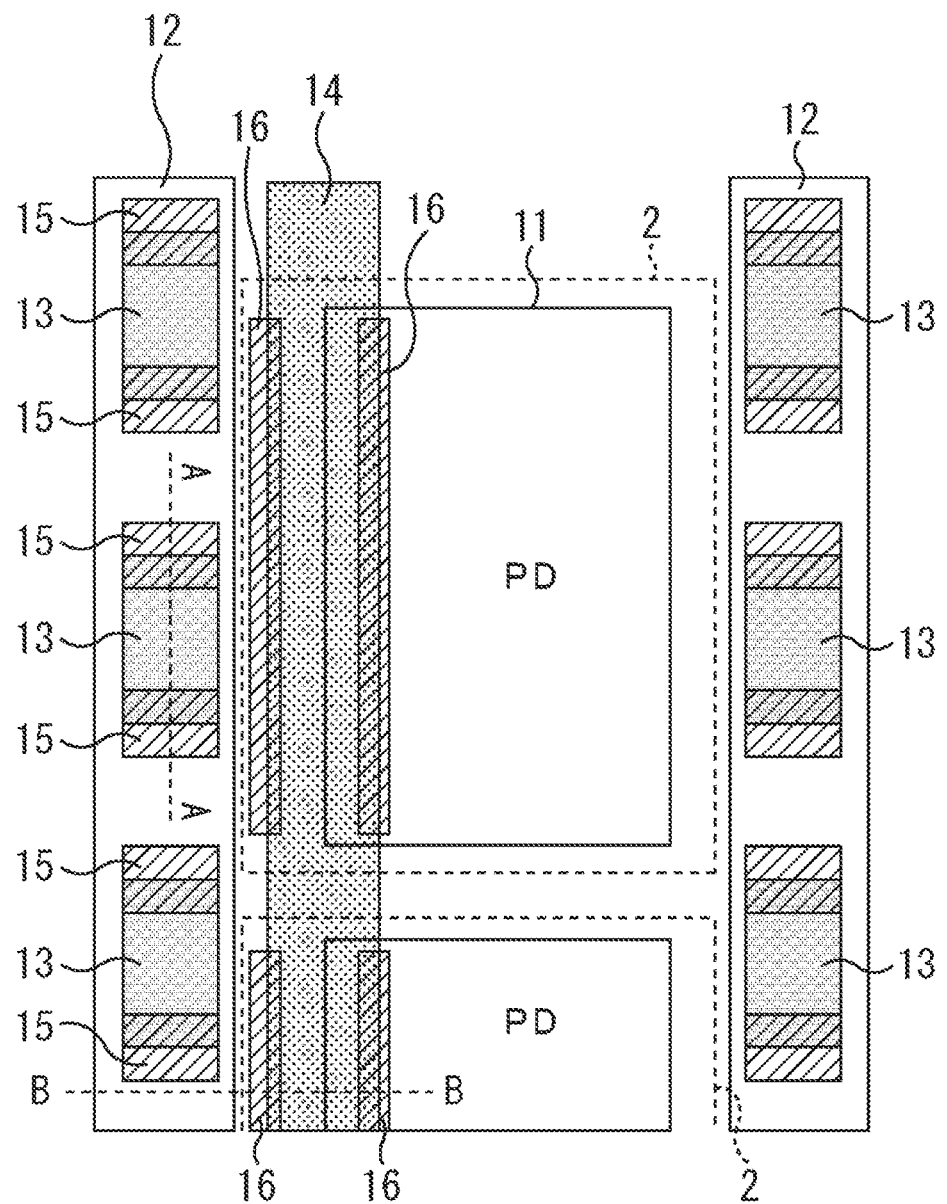
FIG. 2 is a top view of a predetermined pixel and components around the predetermined pixel in an enlarged state.

FIG. 2 shows a top view showing, in an enlarged state, a predetermined pixel of the pixel array section 3 and components around the predetermined pixel. Note that FIG. 2 is the top view as a semiconductor substrate (silicon layer) 21 of the pixel array section 3 is viewed from the top.

A photodiode (PD) 11 is formed in the pixel 2. The photodiode 11 is formed by, for example, PN junction using an N-type semiconductor area as a charge accumulation area. An N-type channel 12 that forms a part of the vertical transfer register 4 is provided adjacent to the pixel 2 to extend in the vertical direction. Potential steps 13 that are areas in which a potential Rp is set deeper are formed at predetermined intervals in the vertical direction in the N-type channel 12. Further, a read-out section 14 that reads out charges accumulated in the photodiode 11 is formed between the photodiode 11 and the N-type channel 12 to extend along the N-type channel 12 in the vertical direction as the N-type semiconductor area.

In the pixel array section 3 having the configuration as described above, each area shown by oblique lines indicates a convex area in which the surface of the semiconductor substrate (silicon layer) 21 is raised. That is, convex portions 15 are formed in boundary areas of the potential step 13 with the N-type channel 12 in the vertical direction to be a charge transfer direction. Further, convex portions 16 are formed also in boundary areas of the read-out section 14 in the horizontal direction to be a charge transfer direction.
<Cross-Sectional View>

Figure 3A:
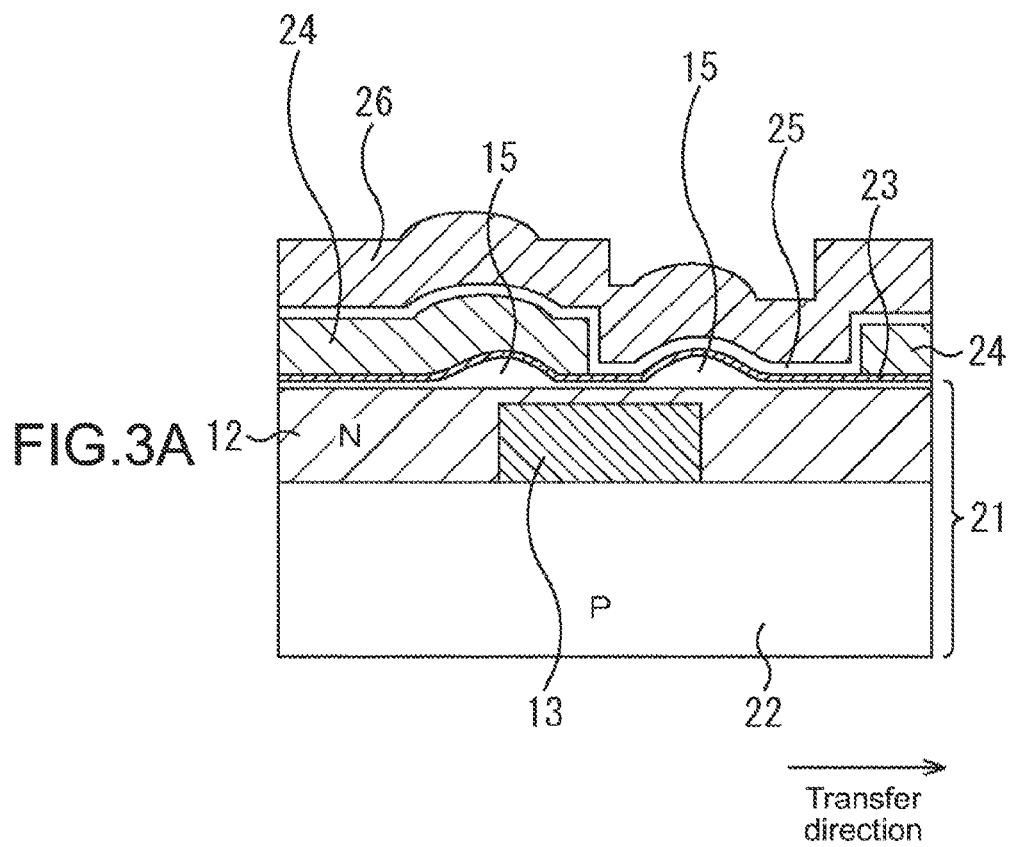
FIGS. 3A and 3B are cross-sectional views of predetermined portions shown in FIG. 2.

FIG. 3A shows a cross-sectional view taken along the line A-A of FIG. 2.

The N-type channel 12 is formed in a P-type (first conductive type) semiconductor area 22 formed in the semiconductor substrate 21 to extend in the transfer direction. Some parts of the N-type channel 12 are the potential steps 13 that are high-density N-type (second conductive type) semiconductor areas. The convex portions 15 are formed at boundary portions of the potential step 13 in the transfer direction on the semiconductor substrate 21.

A transfer gate electrode 24 is formed on a top surface of the semiconductor substrate 21 via a gate oxide film 23. An inter-layer insulating film 25 and a light-shielding film 26 are formed above the transfer gate electrode 24. The inter-layer insulating film 25 also serves as an antireflection film and may be formed of a silicon nitride film (SiN), for example. The light-shielding film 26 may be, for example, a metal film such as tungsten (W).

Figure 3B:
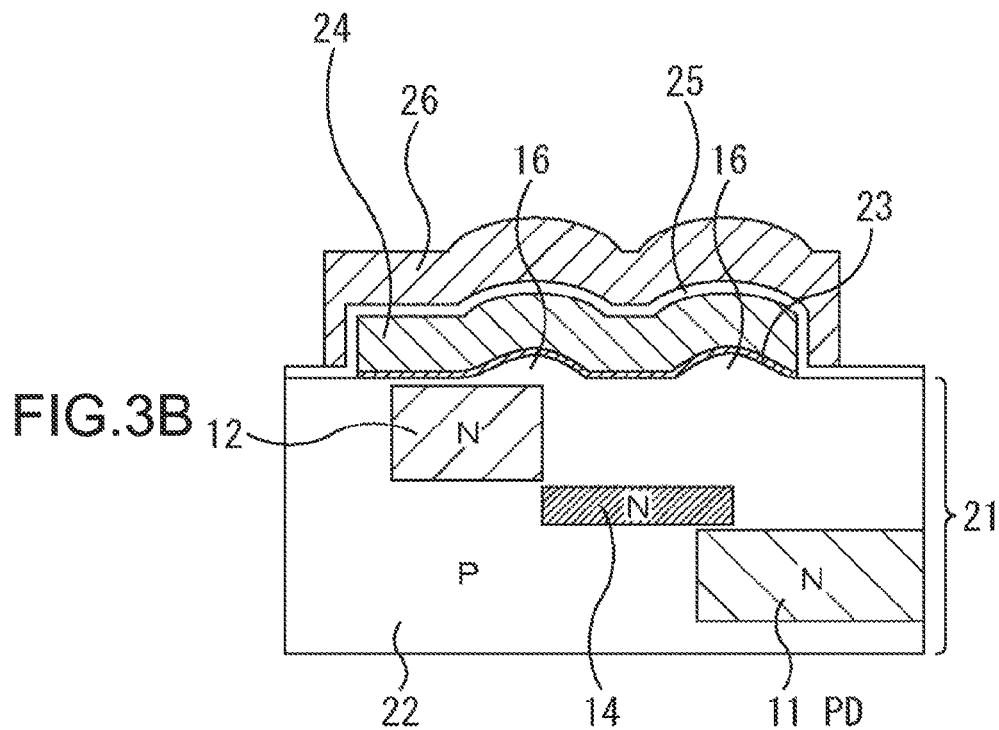

FIG. 3B shows a cross-sectional view taken along the line B-B of FIG. 2.

In addition to the N-type channel 12, the photodiode 11 and the read-out section 14 are formed as the N-type semiconductor areas in the P-type semiconductor area 22 formed in the semiconductor substrate 21. The convex portions 16 are formed at the boundary portions of the read-out section 14 in the horizontal direction in an upper portion of the semiconductor substrate 21.

The transfer gate electrode 24 is formed on the top surface of the semiconductor substrate 21 via the gate oxide film 23. The inter-layer insulating film 25 and the light-shielding film 26 are formed above the transfer gate electrode 24.

As described above, in the CCD solid-state imaging apparatus 1, the convex portions 15 are formed at the boundary portions of the potential step 13 in the transfer direction in the upper portion of the semiconductor substrate 21. The convex portions 16 are also formed at the boundary portions of the read-out section 14 in the horizontal direction in the upper portion of the semiconductor substrate 21. With such a structure, as will be described later, it is possible to reduce remaining charges when charges are transferred and to improve the charge transfer efficiency.

<Manufacturing Method (Vertical Direction)>

Referring to FIGS. 4A to 4H, a method of forming a cross-sectional configuration shown in FIG. 3A will be described.

First, as shown in FIG. 4A, an N-type ion implantation using As (arsenic) or P (phosphorus), for example, is performed within the P-type semiconductor area 22 formed in the semiconductor substrate 21, such that the N-type channel 12 is formed in the transfer direction. After that, a pad oxide film ($SiO_2$) 31 is formed on the surface of the semiconductor substrate 21.

Next, as shown in FIG. 4B, a hard mask 32 for LOCOS formation is formed on a top surface of the pad oxide film 31. The hard mask 32 can be formed of a silicon nitride film (SiN), for example.

As shown in FIG. 4C, by patterning and dry-etching a resist mask (not shown), the hard mask 32 is subjected to pattern processing such that only areas in which the convex portions 15 are to be formed remain.

By thermal oxidation, a LOCOS film 34 is formed and the convex portions 15 are formed below the hard masks 32 as shown in FIG. 4D. Regarding the size of the convex portion 15, the height may be set to 250 nm to 300 nm and the lateral width (width in transfer direction) may be set to 100 to 200 nm, for example. However, these values may be appropriately set depending on the area of the potential step 13.

After that, as shown in FIG. 4E, the hard masks 32 and the LOCOS film 34 are removed. The hard masks 32 made of SiN can be removed by wet etching using hot phosphoric acid. The LOCOS film 34 can be removed by wet etching using dilute hydrofluoric acid (DHF).

Next, as shown in FIG. 4F, a resist mask 35 is patterned such that an area from one top to the other top of the two convex portions 15 formed is opened. An N-type ion implantation is performed. With this, the potential step 13 is formed in the area from the top of the one convex portion 15 to the top of the other convex portion 15 in the N-type channel 12. In other words, in the pattern processing of the hard mask 32 described above with reference to FIG. 4C, the hard mask 32 is subjected to pattern processing such that the tops of the convex portions 15 are formed at two boundary portions of the potential step 13 in the transfer direction.

After the resist masks 35 are removed, the gate oxide film 23 and the transfer gate electrodes 24 are formed as shown in FIG. 4G. After that, as shown in FIG. 4H, the inter-layer insulating film 25 and the light-shielding film 26 are formed.

In this manner, the cross-sectional configuration shown in FIG. 3A is completed.

Note that, in FIG. 4F, after an ion implantation for forming the potential step 13 is performed and the resist masks 35 are removed, the convex portions 15 may be removed by chemical mechanical polishing (CMP), for example, such that the semiconductor substrate 21 is made flat.

<Manufacturing Method (Horizontal Direction)>

Next, referring to FIGS. 5A to 5H, a method of forming a cross-sectional configuration shown in FIG. 3B will be described.

First, as shown in FIG. 5A, an N-type ion implantation using As or P, for example, is performed within the P-type semiconductor area 22 formed in the semiconductor substrate 21, such that the N-type channel 12 is formed. After that, the pad oxide film ($SiO_2$) 31 is formed on the surface of the semiconductor substrate 21.

Next, as shown in FIG. 5B, the hard mask 32 for LOCOS formation is formed on the top surface of the pad oxide film 31. The hard mask 32 can be formed of a silicon nitride film (SiN), for example.

As shown in FIG. 5C, by patterning and dry-etching the resist mask (not shown), the hard mask 32 is subjected to pattern processing such that only the areas in which the convex portions 16 are to be formed remain.

The LOCOS film 34 is formed by thermal oxidation and the convex portions 16 are formed below the hard masks 32 as shown in FIG. 5D. After that, as shown in FIG. 5E, the hard masks 32 and the LOCOS film 34 are removed. The hard masks 32 made of SiN can be removed by wet etching using hot phosphoric acid. The LOCOS film 34 can be removed by wet etching using dilute hydrofluoric acid (DHF).

Next, as shown in FIG. 5F, a resist mask 36 is patterned such that an area from one top to the other top of the two convex portions 16 formed is opened. An N-type ion implantation is performed. With this, the read-out section 14 is formed in the P-type semiconductor area 22 to extend from the top to the other top of the convex portions 16. In other words, in the pattern processing of the hard mask 32 described above with reference to FIG. 5C, the hard mask 32 is subjected to pattern processing such that the tops of the convex portions 16 are formed at two boundary portions of the read-out section 14 in the horizontal direction. As in the case shown in FIGS. 4A to 4H, the convex portions 16 may be made flat by CMP after the read-out section 14 is formed.

The photodiode 11 is also formed in the semiconductor substrate 21 by patterning the resist mask (not shown) corresponding to the area of the photodiode 11 and performing an N-type ion implantation.

As shown in FIG. 5G, the gate oxide film 23 and the transfer gate electrode 24 are formed. After that, as shown in FIG. 5H, the inter-layer insulating film 25 and the light-shielding film 26 are formed.

In this manner, the cross-sectional configuration shown in FIG. 3B is completed.

The method of manufacturing the pixel array section 3 of the CCD solid-state imaging apparatus 1 as viewed in the vertical direction and the horizontal direction has been described with reference to FIGS. 4A to 4H and FIGS. 5A to 5H, respectively. Of course, the identical processes are performed at the same time.

<Potential Diagram>

Referring to FIGS. 6A and 6B, potentials Rp of the potential step 13 and the read-out section 14 will be described.

FIG. 6A shows the potential Rp of the semiconductor substrate 21 in the transfer direction after the N-type ion implantation shown in FIG. 4F. Further, in FIG. 6A, a potential Rp' shown by the dashed line indicates a potential when the N-type ion implantation is performed without forming the convex portions 15.

When the N-type ion implantation is performed without forming the convex portions 15, as shown by the dashed line, the potential Rp' sharply changes at the boundary portions of the resist masks 35, and hence some charges can remain when charges are transferred.

In contrast, in the CCD solid-state imaging apparatus 1, the convex portions 15 are formed at the boundary portions of the resist masks 35 and the N-type ion implantation is performed, and hence the potential Rp slowly changes at the boundary portions of the resist masks 35 as shown in FIG. 6A. The potential Rp has a smooth profile in this manner, and hence it is possible to reduce remaining charges when charges are transferred to the horizontal transfer register 5.

FIG. 6B shows the potential Rp of the semiconductor substrate 21 in the horizontal direction after the N-type ion implantation as shown in FIG. 5F. In FIG. 6B, a potential Rp' shown by the dashed line indicates a potential when the N-type ion implantation is performed without forming the convex portions 16.

Also when the N-type ion implantation for forming the read-out section 14 is performed, the convex portions 16 are formed at the boundary portions of the resist masks 36, and hence the potential Rp slowly changes at the boundary portions of the resist masks 36. The potential Rp has a smooth profile in this manner, and hence it is possible to reduce remaining charges when charges are transferred from the photodiode 11 to the vertical transfer register 4.

As described above, with the CCD solid-state imaging apparatus 1, by forming the convex portions 15 and the convex portions 16 of the semiconductor substrate 21 at the boundary portions in the charge transfer directions in the vertical transfer register 4 and the read-out section 14 as the charge transfer sections, it is possible to provide each potential Rp with the smooth profile. The potentials Rp each having the smooth profile are provided, and hence it is possible to reduce remaining charges when charges are transferred and to improve the charge transfer efficiency.

<2. Second Embodiment>
<Schematic Configuration Example of CMOS Solid-State Imaging Apparatus>

Figure 7:
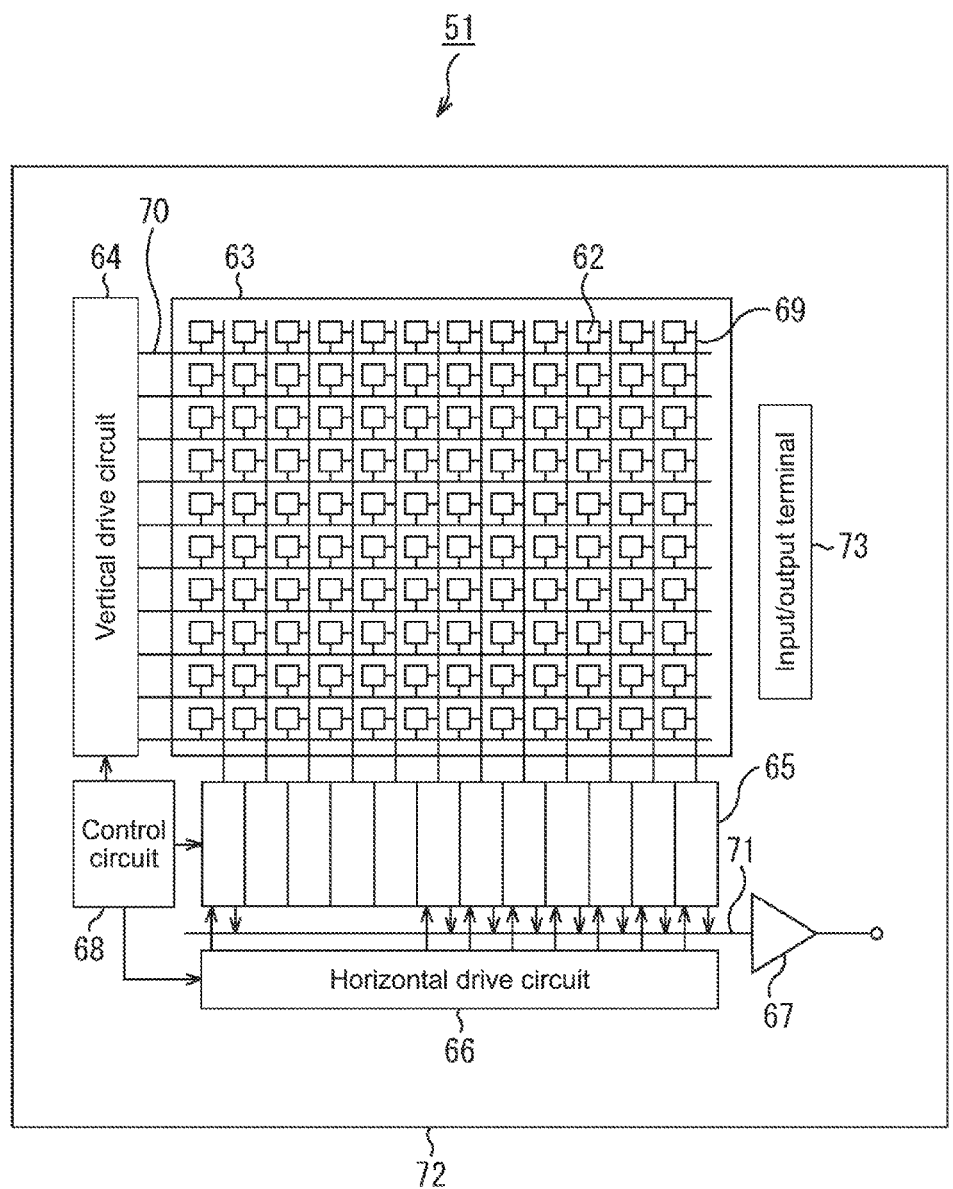
FIG. 7 is a view showing a schematic configuration of a CMOS solid-state imaging apparatus according to a second embodiment of the present disclosure.

FIG. 7 is a view showing a schematic configuration of a CMOS solid-state imaging apparatus according to a second embodiment of the present disclosure.

A CMOS solid-state imaging apparatus 51 of FIG. 7 includes a semiconductor substrate 72 using silicon (Si), for example, as a semiconductor. The CMOS solid-state imaging apparatus 51 of FIG. 7 includes, in the semiconductor substrate 72, a pixel array section 63 with pixels 62 two-dimensionally arranged in a matrix form and peripheral circuit sections around the pixel array section 63. The peripheral circuit sections include a vertical drive circuit 64, a column signal processing circuit 65, a horizontal drive circuit 66, an output circuit 67, a control circuit 68, and the like.

Each of the pixels 62 includes a photodiode serving as a photoelectric conversion element and a plurality of pixel transistors. The plurality of pixel transistors include, for example, four MOS transistors of a transfer transistor, a selection transistor, a reset transistor, and an amplifying transistor.

Alternatively, the pixels 62 may have a shared pixel structure. The pixel sharing structure includes a plurality of photodiodes, a plurality of transfer transistors, a shared single floating diffusion, and alternately shared different pixel transistors. That is, in a shared pixel, photodiodes and transfer transistors constituting a plurality of unit pixels alternately share different pixel transistors.

The control circuit 68 receives an input clock and data for instructing an operation mode and the like and outputs data such as inside information of the CMOS solid-state imaging apparatus 51. That is, based on a vertical synchronization signal, a horizontal synchronization signal, and a master clock, the control circuit 68 generates a clock signal and a control signal as references of operations of the vertical drive circuit 64, the column signal processing circuit 65, and the horizontal drive circuit 66, and the like. The control circuit 68 outputs the generated clock signal and control signal to the vertical drive circuit 64, the column signal processing circuit 65, the horizontal drive circuit 66, and the like.

The vertical drive circuit 64 is constituted of a shift register, for example. The vertical drive circuit 64 selects a pixel driving wire 70, provides the selected pixel driving wire 70 with a pulse for driving the pixels 62, and drives the pixels 62 for each row. That is, the vertical drive circuit 64 selectively scans the pixels 62 of the pixel array section 63 sequentially in the vertical direction for each row, and provides a pixel signal based on the signal charge generated depending on the amount of received light in a photoelectric conversion section of each pixel 62 to the column signal processing circuit 65 via a vertical signal line 69.

The column signal processing circuit 65 is provided for each column of the pixels 62 and subjects signals output from the pixels 62 in one row to signal processing such as noise cancellation for each pixel column. For example, the column signal processing circuit 65 performs signal processing such as correlated double sampling (CDS) and AD conversion for cancelling fixed-pattern noise specific to the pixels.

The horizontal drive circuit 66 is constituted of a shift register, for example. The horizontal drive circuit 66 outputs sequentially horizontal scanning pulses, to thereby select the column signal processing circuits 65 in order, and causes each of the column signal processing circuits 65 to output a pixel signal to a horizontal signal line 71.

The output circuit 67 subjects signals sequentially supplied from each of the column signal processing circuits 65 through the horizontal signal line 71 to signal processing and outputs the signals. For example, the output circuit 67 may perform only buffering or may perform black level adjustment, column variation correction, various digital signal processing, and the like. An input/output terminal 73 transmits and receives signals to/from external devices.

The CMOS solid-state imaging apparatus 51 configured in the above-mentioned manner is a CMOS image sensor called column AD system in which each pixel column is provided with the column signal processing circuit 65 that performs CDS processing and AD conversion processing.

<First Configuration Example of Pixel>

Figure 8:
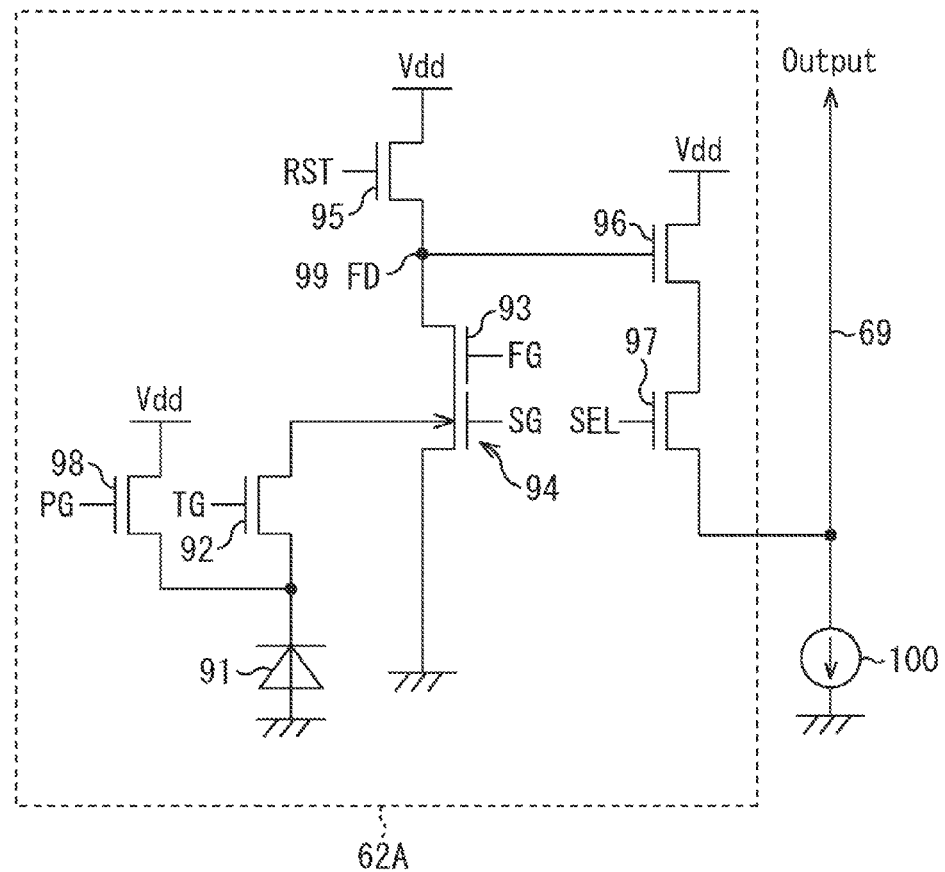
FIG. 8 is a view showing a first configuration example of the pixel of FIG. 7.

FIG. 8 shows a circuit configuration example of a pixel 62A as a first configuration example of the pixel 62.

The pixel 62A shown in FIG. 8 includes, for example, a PN-junction photodiode (PD) 91 as the photoelectric conversion section that receives light, generates signal charges, and accumulates the signal charges. Further, the pixel 62A includes a first transfer gate 92, a second transfer gate 93, a charge accumulation section (MEM) 94, a reset gate 95, an amplifying transistor 96, a selection transistor 97, a charge discharging gate 98, and a floating diffusion (FD) 99.

The first transfer gate 92 is connected between the photodiode 91 and the charge accumulation section 94. A transfer signal TG is applied to a gate electrode of the first transfer gate 92. One of a source and a drain of the first transfer gate 92 is connected to the photodiode 91. When the transfer signal TG is activated, the first transfer gate 92 becomes a conductive state in response to this, to thereby transfer signal charges accumulated in the photodiode 91 to the charge accumulation section 94.

The second transfer gate 93 is connected between the charge accumulation section 94 and an FD 99. A transfer signal FG is applied to a gate electrode of the second transfer gate 93. One of a source and a drain of the second transfer gate 93 is connected to the FD 99 to which a gate electrode of the amplifying transistor 96 is connected. When the transfer signal FG is activated, the second transfer gate 93 becomes a conductive state in response to this, to thereby transfer signal charges accumulated in the charge accumulation section 94 to the FD 99.

One of a source and a drain of the reset gate 95 is connected to a power-supply voltage Vdd. The other is connected to the FD 99. A reset signal RST is applied to a gate electrode of the reset gate 95. When the reset signal RST is activated, the reset gate 95 becomes a conductive state in response to this, to thereby reset the potential of the FD 99 to the level of the power-supply voltage Vdd.

The charge accumulation section 94 is provided between the first transfer gate 92 and the second transfer gate 93 as a buried MOS capacitor. A control signal SG is applied to a gate electrode of the charge accumulation section 94. The charge accumulation section 94 temporarily retains signal charges generated in the photodiode 91 until a readout timing comes.

The gate electrode of the amplifying transistor 96 is connected to the FD 99 and a drain electrode thereof is connected to the power-supply voltage Vdd. The amplifying transistor 96 serves as an input of a read-out circuit that reads out signal charges obtained by the photoelectrical conversion in the photodiode 91, that is, a so-called source follower circuit. That is, the amplifying transistor 96 constitutes, when a source electrode is connected to the vertical signal line 69 via the selection transistor 97, the source follower circuit together with a load MOS of a constant-current source circuit 100 connected to one end of the vertical signal line 69.

The selection transistor 97 is connected between a source electrode of the amplifying transistor 96 and the vertical signal line 69. A selection signal SEL is applied to a gate electrode of the selection transistor 97. When the selection signal SEL is activated, the selection transistor 97 becomes a conductive state in response to this to bring the pixel 62A in a selective state, and outputs a pixel signal output from the amplifying transistor 96 to the vertical signal line 69.

The charge discharging gate 98 is connected between the photodiode 91 and the power-supply voltage Vdd serving as a charge discharging portion. A charge discharging control signal PG is applied to a gate electrode of the charge discharging gate 98. When the charge discharging control signal PG is activated, the charge discharging gate 98 becomes a conductive state in response to this and selectively discharges a predetermined amount of signal charges or all signal charges, which have been accumulated in the photodiode 91, from the photodiode 91 to the charge discharging portion. The charge discharging gate 98 is held in a conductive state during a period when the accumulation of the signal charges is not performed, and hence it is possible to avoid the photodiode 91 from being saturated with the signal charges and the signal charges beyond its saturated charge amount from leaking out to the charge accumulation section 94 or surrounding pixels.

The FD 99 converts a signal charge into an electrical signal, for example, a voltage signal and outputs the electrical signal.

<Exposure Operation>

FIGS. 9A to 9E are views explaining an operation from the start of exposure (start of accumulation) to the end of exposure (end of accumulation) of the pixel 62A shown in FIG. 8.

First, as shown in FIG. 9A, the charge discharging control signal PG is activated, and hence the charge discharging gate 98 is turned on and charges of the photodiode 91 are discharged.

When the charge discharging gate 98 is turned off again, the exposure is started in all pixels and, as shown in FIG. 9B, signal charges depending on incident light are accumulated in the photodiode (PD) 91.

When the exposure is terminated, the reset signal RST is activated as shown in FIG. 9C, and hence the reset gate 95 is turned on and the charges of the FD 99 are discharged (reset operation).

As shown in FIG. 9D, the transfer signal TG and the control signal SG are activated, and hence the signal charges are transferred from the photodiode 91 to the charge accumulation section (MEM) 94.

After that, when a read-out timing of the pixel 62A comes, the transfer signal FG is activated as shown in FIG. 9E, and hence the second transfer gate 93 is turned on and the signal charges are transferred from the charge accumulation section 94 to the FD 99. The signal charges are converted into voltage signals in the FD 99 and output via the vertical signal line 69.

As described above, in the CMOS solid-state imaging apparatus 51 including the pixel 62A of FIG. 8, the exposure operations are performed in all pixels within the pixel array section 63 at the same time and charges are read out while imaging by a global shutter method in which charges are temporarily retained in the charge accumulation section (MEM) 94 is performed.

Figure 10:
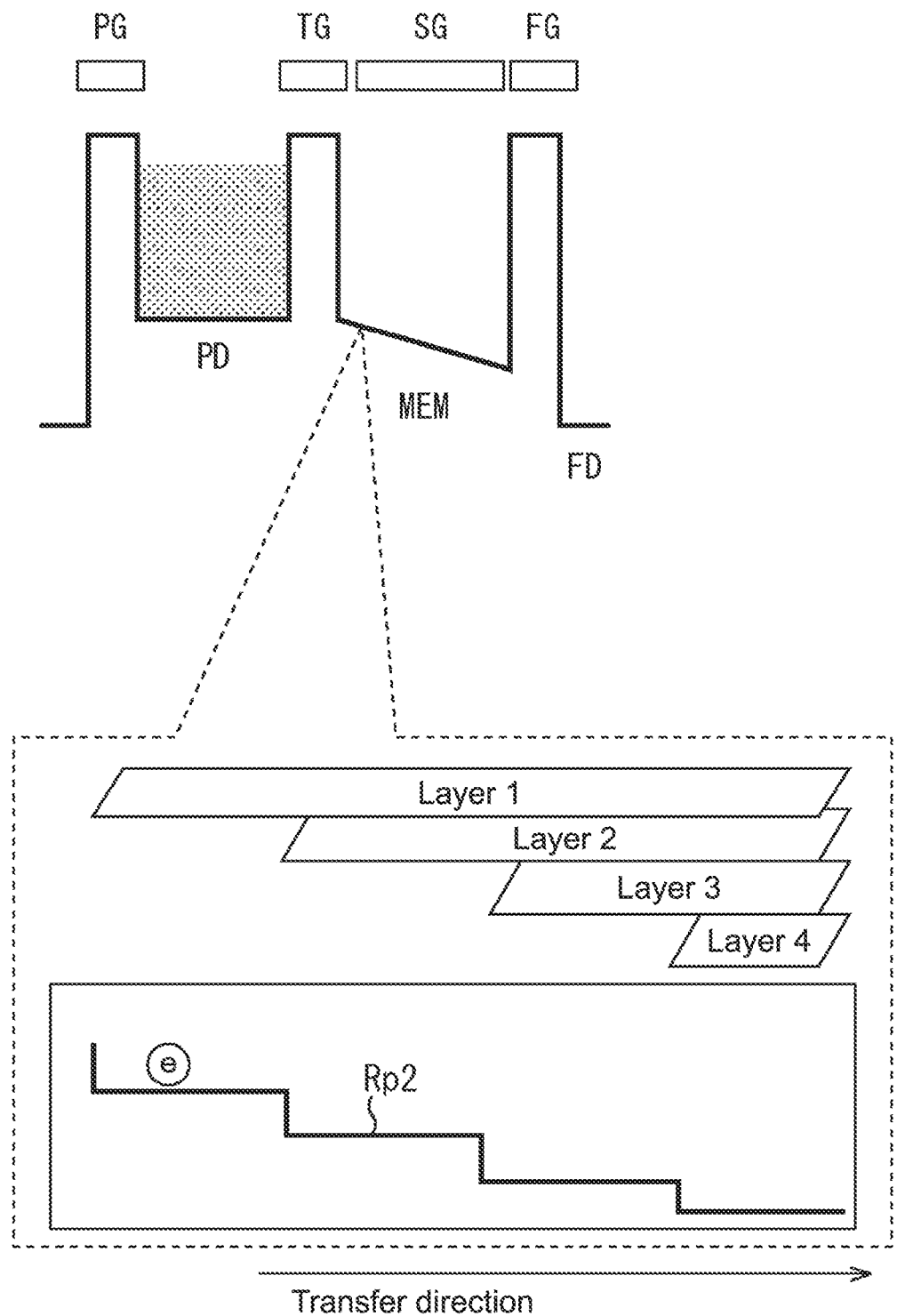
FIG. 10 is a view showing a potential of a charge accumulation section.

Here, in the charge accumulation section 94, in order to reduce the transfer failure when charges are transferred to the FD 99, a potential Rp2 is provided with a stair-like slope in a direction of the FD 99 that is the transfer direction as shown in FIG. 10. This stair-like potential slope can be formed by setting ion implantation areas in different areas and performing a plurality of ion implantations. More specifically, as shown in FIG. 10, for example, the stair-like potential slope can be formed by setting an area of a layer 1, an area of a layer 2, an area of a layer 3, and an area of a layer 4 and performing a plurality of ion implantations.

Figure 11:
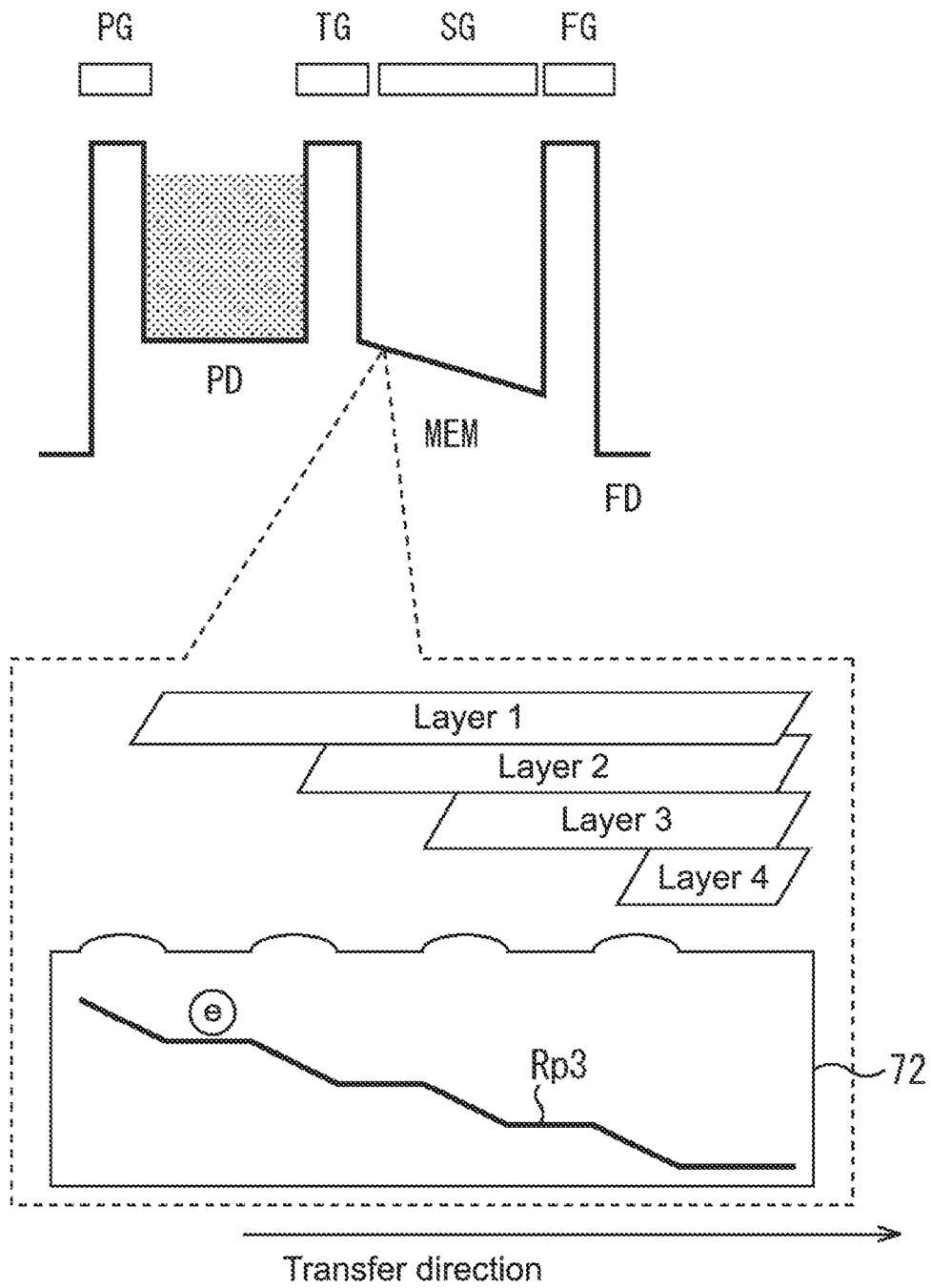
FIG. 11 is a view showing a potential of the charge accumulation section according to the second embodiment of the present disclosure.

Also in such a stair-like potential slope of the charge accumulation section 94, convex portions are formed in a surface of the semiconductor substrate 72 as shown in FIG. 11, and hence it is possible to provide a potential Rp3 with smoothed stair-like steps and to reduce remaining charges when charges are transferred.

That is, the potential Rp2 of FIG. 10 shows a potential profile in the case where the convex portions are not formed and the potential Rp3 of FIG. 11 shows a potential profile of the charge accumulation section 94 in the case where the convex portions are formed.

<Manufacturing Method>

Referring to FIGS. 12A to 12H, a method of forming the charge accumulation section 94 with the potential profile shown in FIG. 11 will be described.

First, as shown in FIG. 12A, an N-type ion implantation using As or P, for example, is performed within a P-type semiconductor area 121 formed in the semiconductor substrate 72, such that an N-type semiconductor area 122 to be the charge accumulation section 94 is formed. After that, a pad oxide film (SiO$_2$) 123 is formed on the surface of the semiconductor substrate 72.

Next, as shown in FIG. 12B, a hard mask 124 for LOCOS formation is formed on a top surface of the pad oxide film 123. The hard mask 124 can be formed of, for example, a silicon nitride film (SiN).

As shown in FIG. 12C, by patterning and dry-etching a resist mask (not shown), the hard mask 124 is subjected to pattern processing such that only areas in which convex portions are to be formed remain.

As shown in FIG. 12D, a LOCOS film 125 is formed and convex portions 131 are formed below the hard masks 124 by thermal oxidation. After that, as shown in FIG. 12E, the hard masks 124 and the LOCOS film 125 are removed. The hard masks 124 made of SiN can be removed by wet etching using hot phosphoric acid. The LOCOS film 125 can be removed by wet etching using dilute hydrofluoric acid (DHF).

Subsequently, as shown in FIG. 12F, a resist mask 141 is patterned such that the area of the layer 1 is opened and an N-type ion implantation is performed.

After the resist mask 141 is removed for the layer 1, a resist mask 142 is patterned such that the area of layer 2 is opened and an N-type ion implantation is performed as shown in FIG. 12G. The same ion implantations corresponding to the number of stair-like steps are performed in different areas.

When the ion implantations are completed, a gate oxide film 151 and a transfer gate electrode 152 are formed above the top surface of the semiconductor substrate 72 as shown in FIG. 12H.

As described above, the convex portions 131 are formed by a LOCOS method in portions to be boundaries of areas when the N-type semiconductor area 122 to be the charge accumulation section 94 of the semiconductor substrate 72 is subjected to a plurality of ion implantations, and then the plurality of ion implantations are performed.

With this, it is possible to provide the potential profile with smoothed stair-like steps as shown in FIG. 11, and hence it is possible to reduce the remaining charges and to improve the charge transfer efficiency.

<Second Configuration Example of Pixel>

Figure 13:
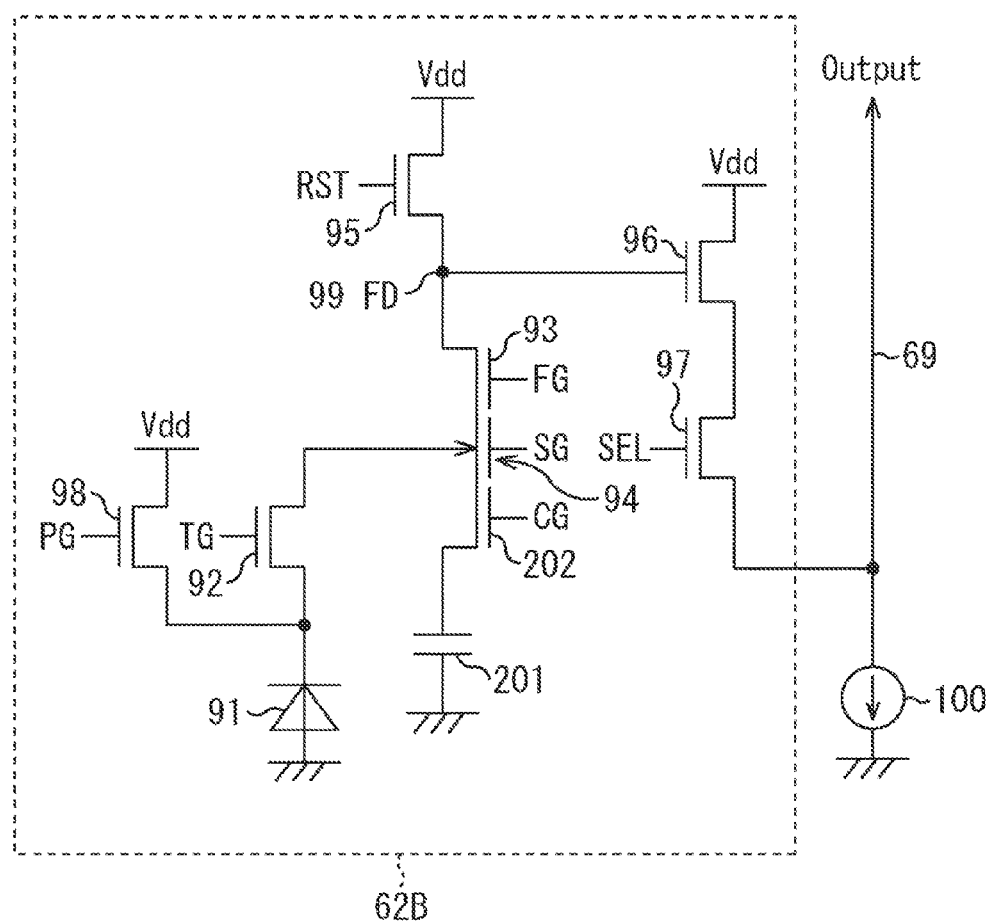
FIG. 13 is a view showing a second configuration example of the pixel of FIG. 7.

FIG. 13 is a circuit configuration example of a pixel 62B as a second configuration example of the pixel 62.

In FIG. 13, portions corresponding to those of the pixel 62A as the first configuration example shown in FIG. 8 are denoted by the same reference symbols and descriptions thereof will be appropriately omitted.

The pixel 62B of FIG. 13 further includes, in addition to the charge accumulation section 94, a second charge accumulation section 201. Between the second charge accumulation section 201 and the charge accumulation section 94, a third transfer gate 202 is newly provided.

In order to clearly discriminate the charge accumulation section 94 from the second charge accumulation section 201, the charge accumulation section 94 will be referred to as a first charge accumulation section 94 in the following description.

A transfer signal CG is applied to a gate electrode of the third transfer gate 202. When the transfer signal CG is activated, the third transfer gate 202 becomes a conductive state in response to this, to thereby control a potential to be deep in a path between the first charge accumulation section 94 and the second charge accumulation section 201.

The pixel 62B is a pixel circuit that maintains the dark characteristics and has a large saturated charge amount by using a first accumulation volume excellent in the dark characteristics and a second accumulation volume giving priority to the area efficiency. The second charge accumulation section 201 is constituted of a capacitor having a larger capacitance value per unit area than the first charge accumulation section 94.

Figure 14:
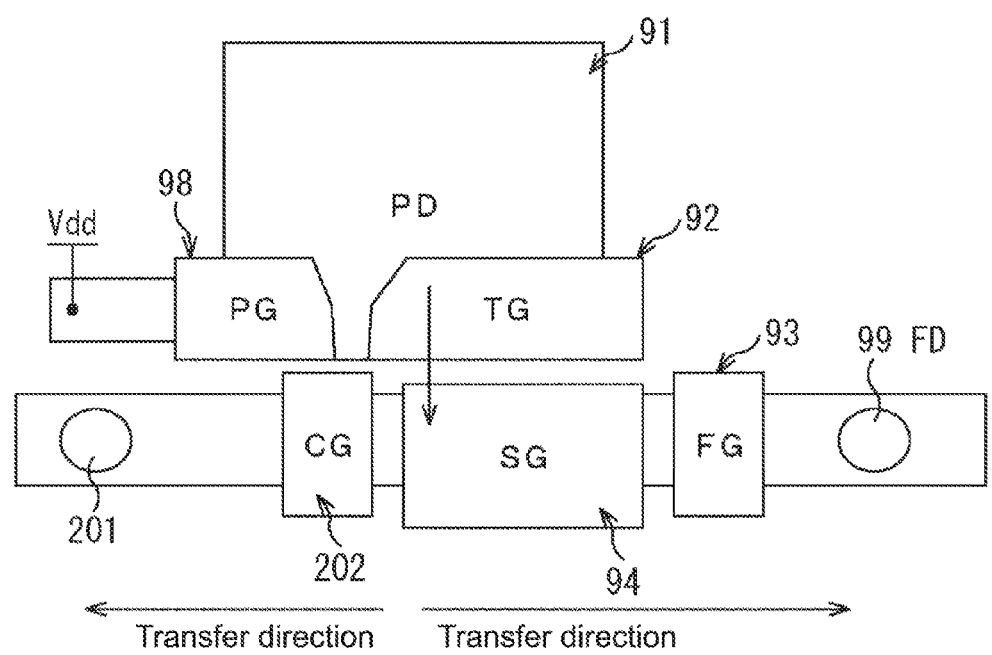
FIG. 14 is a top view of the pixel of FIG. 13.

FIG. 14 shows a top view of the pixel 62B.

The first transfer gate 92 including the gate electrode to which the transfer signal TG is applied is connected between the photodiode 91 and the first charge accumulation section 94. The charge discharging gate 98 including the gate electrode to which the charge discharging control signal PG is applied is connected between the photodiode 91 and the power-supply voltage Vdd serving as the charge discharging portion.

The first charge accumulation section 94 includes the gate electrode to which the control signal SG is applied and is formed as a buried MOS capacitor below the gate electrode.

The second transfer gate 93 including the gate electrode to which the transfer signal FG is applied is connected between the first charge accumulation section 94 and the FD 99. One of the source/drain of the second transfer gate 93 is shared with the N-type semiconductor area of the first charge accumulation section 94. The other of the source/drain is shared with the N-type semiconductor area of the FD 99.

The third transfer gate 202 includes the gate electrode to which the transfer signal CG is applied. One of the source/drain of the third transfer gate 202 is shared with the N-type semiconductor area of the first charge accumulation section 94. The other of the source/drain is connected to the second charge accumulation section 201.

<Circuit Operations of Pixel 62B>

Figure 15:
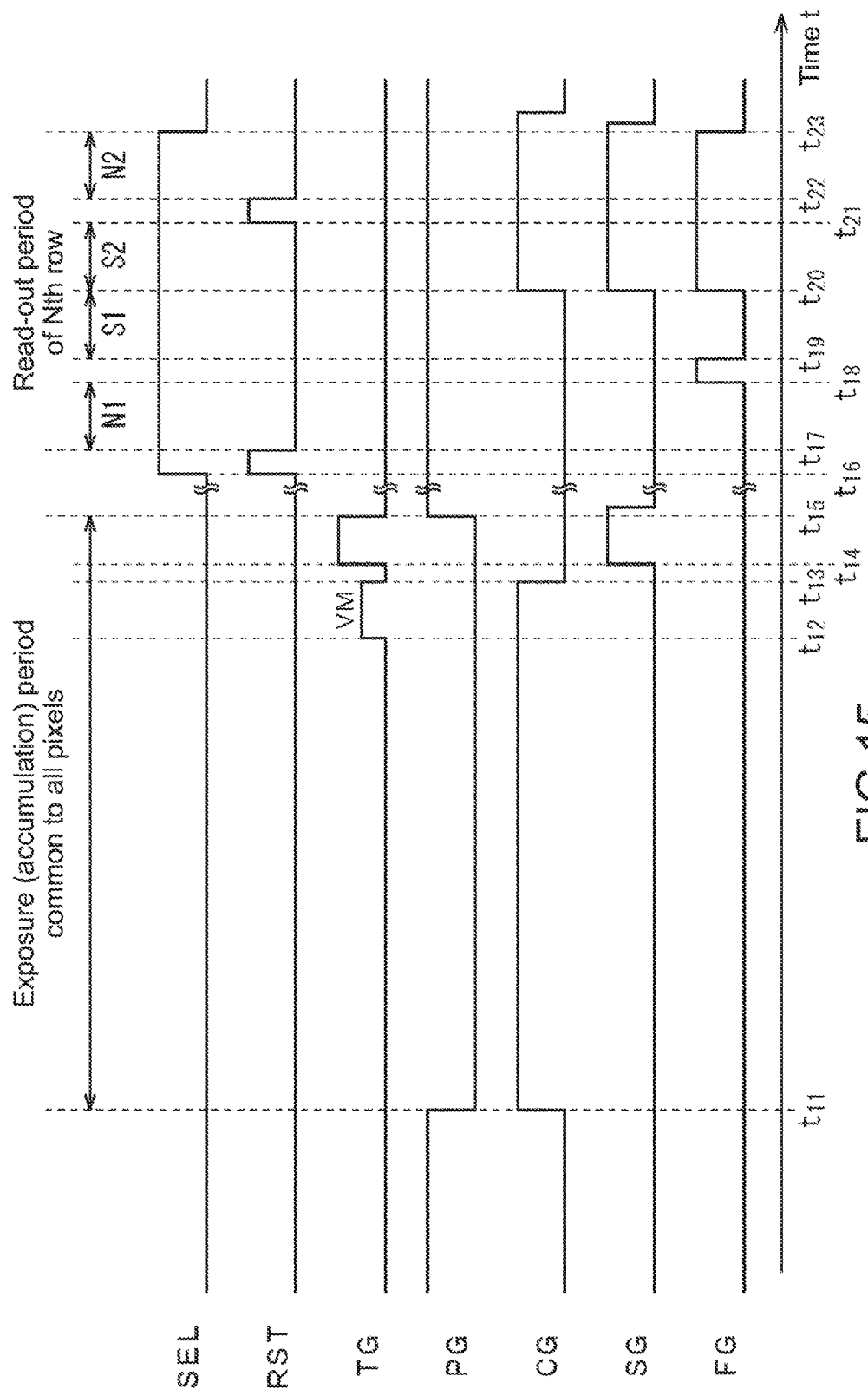
FIG. 15 is a view explaining circuit operations of the pixel of FIG. 13.

Referring to FIGS. 16A to 16I and FIG. 15, circuit operations of the pixel 62B will be described. FIG. 15 shows a timing chart of a selection signal SEL, a reset signal RST, a transfer signal TG, a charge discharging control signal PG, a transfer signal CG, a control signal SG, and a transfer signal FG in the pixel 62B. Further, FIGS. 16A to 16I show potential diagrams in a predetermined operating state of the pixel 62B.

Figure 16A:
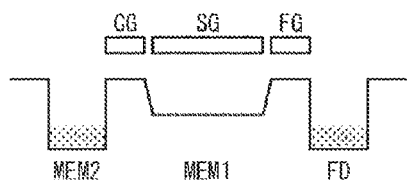
FIGS. 16A to 16I are potential diagrams of the pixel of FIG. 13.

FIG. 16A shows a potential of an initial state immediately before a point of time $t_{11}$. At the point of time $t_{11}$, charge discharging control signals PG in all pixels are inactivated at the same time and charge discharging gates 98 become a non-conductive state, and then exposure periods are started in all the pixels of the pixel array section 63. At the point of time $t_{11}$, the transfer signals CG are activated at the same time, and hence the third transfer gate 202 becomes a conductive state.

Figure 16F:
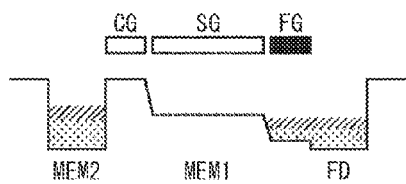
Figure 16B:
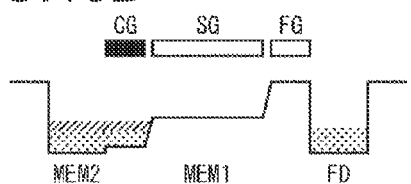

During the exposure period, with high intensity, signal charges are accumulated not only in the photodiode 91 but also in the first charge accumulation section (MEM1) 94 overflowing from the photodiode 91 via an overflow path of the first transfer gate 92. In addition, as shown in FIG. 16B, the third transfer gate 202 is held in a conductive state, and hence the signal charges flowing out to the first charge accumulation section 94 are accumulated in a second charge accumulation section (MEM2) 201 via the third transfer gate 202. On the other hand, with low intensity, accumulation of the signal charges is performed only in the photodiode 91.

Next, at a point of time $t_{12}$, by driving the transfer signal TG at a middle potential VM, signal charges beyond a predetermined charge amount determined by the middle potential VM are, from the photodiode 91 via the first transfer gate 92, accumulated in both the first charge accumulation section 94 and the second charge accumulation section 201.

Figure 16G:
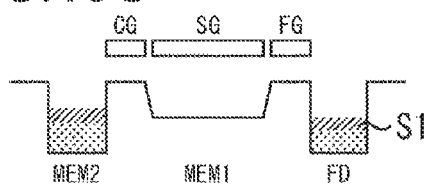
Figure 16C:
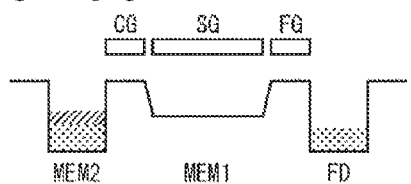

Next, at a point of time $t_{13}$, the transfer signal CG is inactivated, and hence, as shown in FIG. 16C, the third transfer gate 202 becomes a non-conductive state.

Figure 16H:
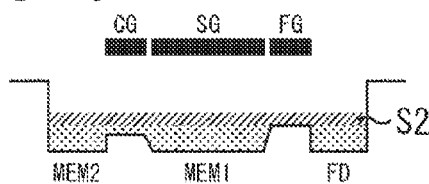
Figure 16D:
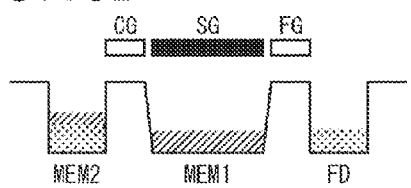

Subsequently, at a point of time $t_{14}$, transfer signals TG and control signals SG in all the pixels are activated at the same time, and hence the first transfer gate 92 and the gate electrode of the first charge accumulation section 94 become a conductive state. With this, as shown in FIG. 16D, the signal charges accumulated in the photodiode 91 are transferred to the first charge accumulation section 94 and accumulated.

Next, at a point of time $t_{15}$, when the transfer signals TG in all the pixels are inactivated at the same time, the charge discharging control signals PG are activated at the same time. Then, the first transfer gate 92 becomes a non-conductive state and the charge discharging gate 98 becomes a conductive state. With this, the exposure period common to all the pixels is terminated. After that, the control signal SG is also inactivated.

Figure 16I:
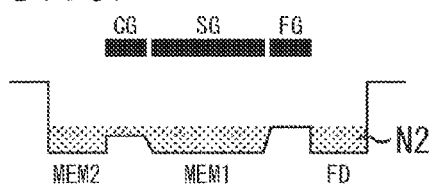
Figure 16E:
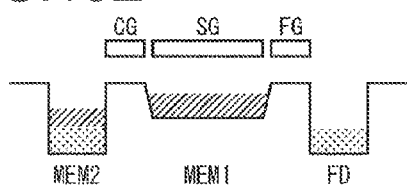

FIG. 16E shows a state of a potential at the end of exposure. At this time, the signal charges with high intensity are accumulated in both the first charge accumulation section 94 and the second charge accumulation section 201. On the other hand, the signal charges with low intensity are accumulated only in the first charge accumulation section 94.

Next, at a point of time $t_{16}$, the selection signal SEL in an N-th row is activated and the selection transistor 97 in the N-th row becomes a conductive state, and hence the pixel 62B in the N-th row becomes a selected state. At the same time, the reset signal RST is activated and the reset gate 95 becomes a conductive state, and hence the FD 99 is reset. At a point of time $t_{17}$, the reset signal RST is inactivated and a potential of the FD 99 at this time is output as a first reset level N1 to the vertical signal line 69 through the amplifying transistor 96 and the selection transistor 97.

Next, at a point of time $t_{18}$, the transfer signal FG is activated, and hence the second transfer gate 93 becomes a conductive state. As shown in FIG. 16F, the signal charges accumulated in the first charge accumulation section 94 are transferred to the FD 99.

At a point of time $t_{19}$, as shown in FIG. 16G, the transfer signal FG is inactivated, and hence transfer of the signal charges from the first charge accumulation section 94 to the FD 99 is terminated. The potential of the FD 99 at a point of time $t_{19}$ when the transfer is terminated is output, as a first signal level S1 depending on an accumulated charge amount of the first charge accumulation section 94, to the vertical signal line 69 through the amplifying transistor 96 and the selection transistor 97.

Next, at a point of time $t_{20}$, the transfer signal CG, the control signal SG, and the transfer signal FG are activated at the same time and the third transfer gate 202 and the second transfer gate 93 both become a conductive state. With this, as shown in FIG. 16H, potentials of the second charge accumulation section 201, the first charge accumulation section 94, and the FD 99 are combined, and hence the signal charges are accumulated in the entire combined areas. The signal charges are output as a second signal level S2 to the vertical signal line 69 through the amplifying transistor 96 and the selection transistor 97.

Subsequently, at a point of time $t_{21}$, the reset signal RST is activated and the area in which the potentials are combined is reset.

At a point of time $t_{22}$, the reset signal RST is inactivated and the potential of the potential-combined area, which is shown in FIG. 16I, is output as a second reset level N2 to the vertical signal line 69 through the amplifying transistor 96 and the selection transistor 97.

After that, after a point of time $t_{23}$, the transfer signal FG, the control signal SG, and the transfer signal CG are inactivated in the stated order and the second transfer gate 93 and the third transfer gate 202 become a non-conductive state. With this, a potential in the initial state as shown in FIG. 16A is obtained again. Inactivating the transfer signal FG, the control signal SG, and the transfer signal CG in the stated order is for accumulating channel charges, which are accumulated in the substrate surface when the gate electrode of the first charge accumulation section 94 is in a conductive state, in the second charge accumulation section 201. Different from the FD 99, resetting is not performed only for the second charge accumulation section 201, and hence there is no fear that resetting of the channel charges may give rise to an offset in a pixel signal.

By the above-mentioned series of circuit operations, the first reset level N1, the first signal level S1, the second signal level S2, and the second reset level N2 are output from the pixel 62B to the vertical signal line 69 in the above-mentioned order.

The first reset level N1 and the first signal level S1 are pixel signals excellent in the dark characteristics with low intensity and the second signal level S2 and the second reset level N2 are pixel signals having a large saturated charge amount with high intensity.

It is desirable to read out a low-intensity pixel signal in a high-gain setting for reducing noise is reduced and to read out a high-intensity pixel signal in a low-gain setting for the wide signal range. Thus, it can be said that the pixel 62B according to a second configuration example has a circuit configuration that enables the low-intensity pixel signal (S1-N1) in the high-gain setting and the high-intensity pixel signal (S2-N2) in the low-gain setting to be acquired.

A manufacturing method in which convex portions are formed in portions to be boundaries of areas when a plurality of ion implantations are performed, and then the plurality of ion implantations are performed as described above with reference to FIGS. 12A to 12H can be employed also in the N-type semiconductor area to be the first charge accumulation section 94 of the pixel 62B as described above.

Figure 17:
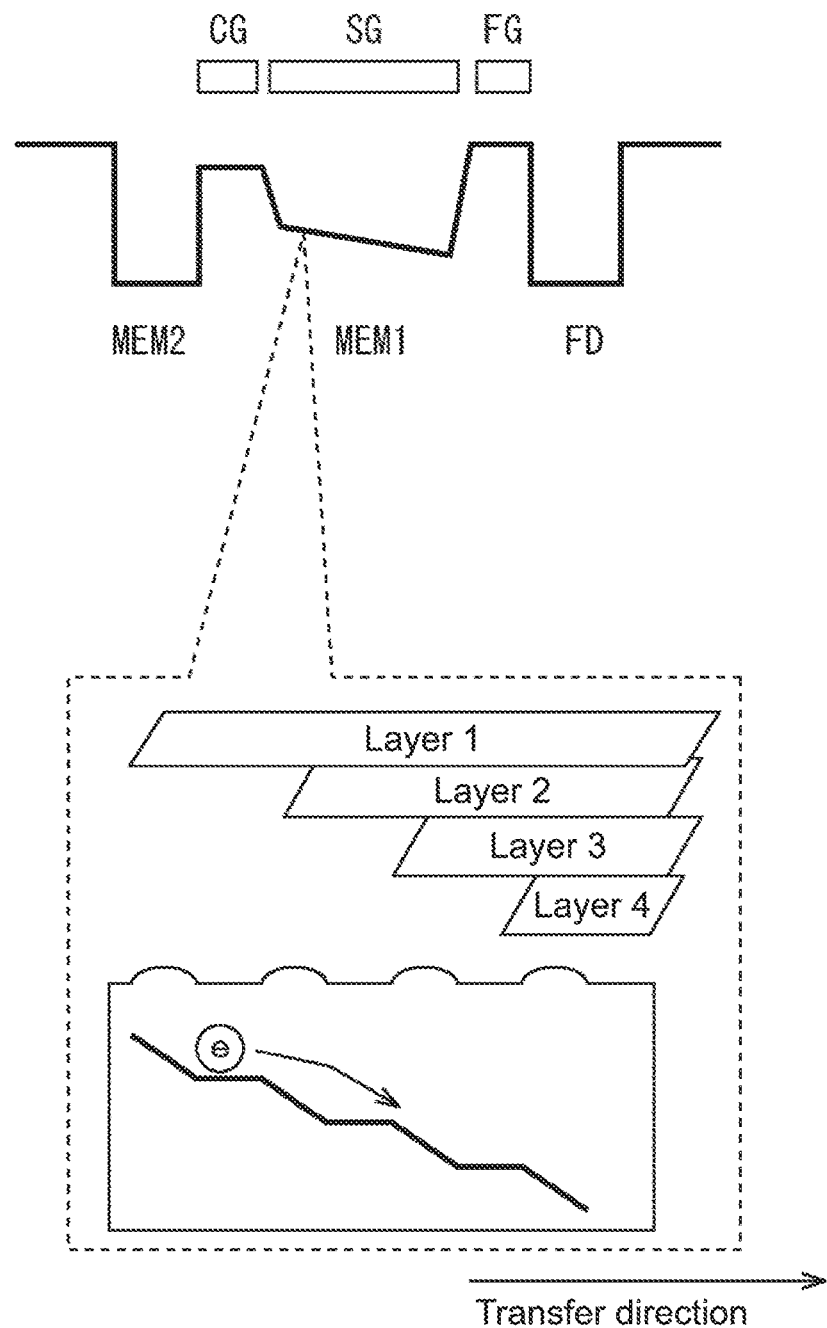
FIG. 17 is a view showing a potential of the charge accumulation section according to the second embodiment of the present disclosure.

With this, as shown in FIG. 17, it is possible to provide the first charge accumulation section 94 with the potential profile with smoothed stair-like steps, and hence it is possible to reduce the remaining charges and improve the charge transfer efficiency.

<3. Third Embodiment>
<Application Example to Electronic Apparatus>

The above-mentioned CCD solid-state imaging apparatus 1 and CMOS solid-state imaging apparatus 51 are applicable to various electronic apparatuses, for example, an imaging apparatus such as a digital still camera and digital video camera, a cellular phone with an imaging function, or an audio player with an imaging function.

Figure 18:
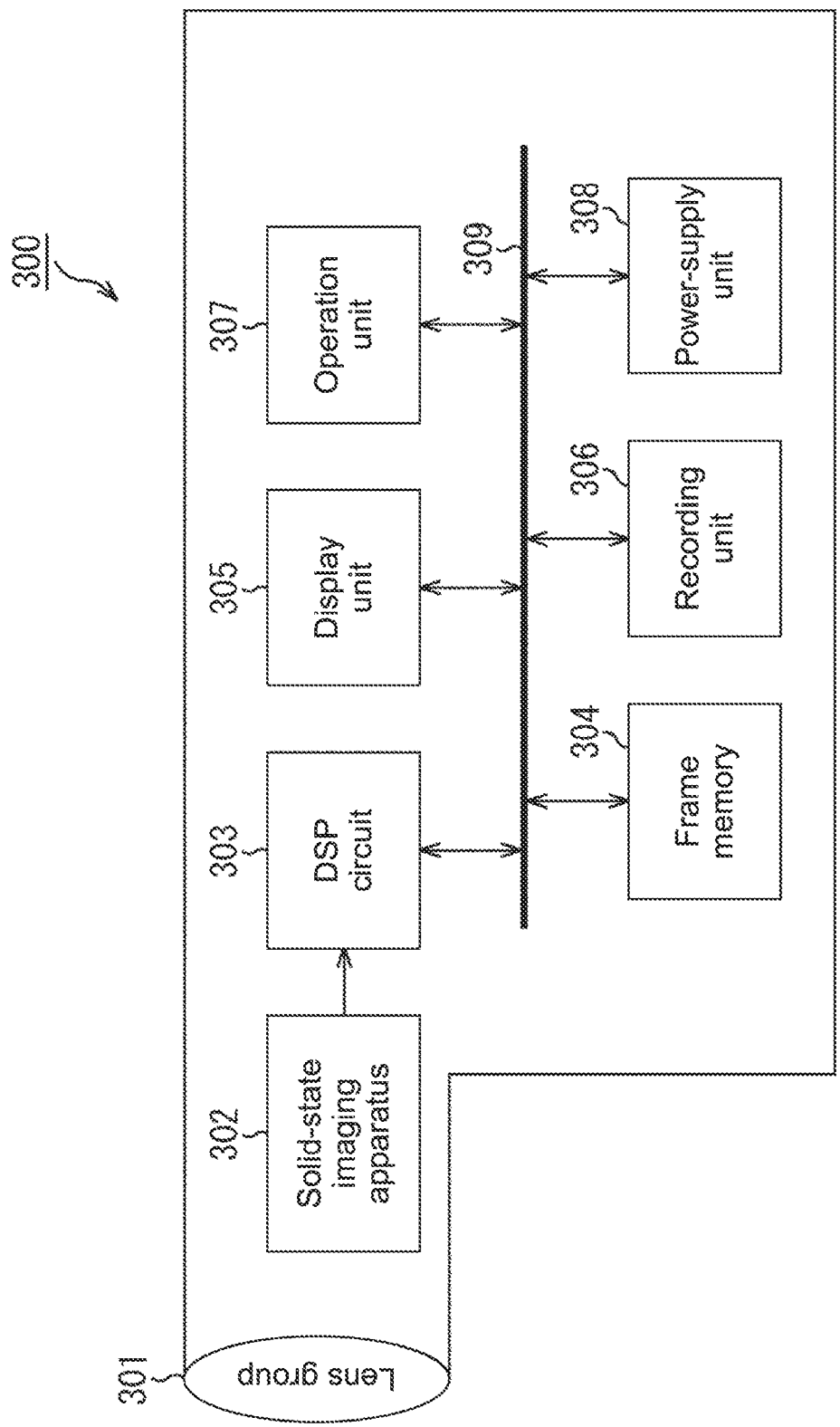
FIG. 18 is a block diagram showing a configuration example of an imaging apparatus serving as an electronic apparatus according to a third embodiment of the present disclosure.

FIG. 18 is a block diagram showing a configuration example of an imaging apparatus serving as the electronic apparatus according to a third embodiment of the present disclosure.

An imaging apparatus 300 shown in FIG. 18 includes an optical unit 301 including a lens group and the like, a solid-state imaging apparatus (imaging device) 302 in which the above-mentioned configuration of the CCD solid-state imaging apparatus 1 or the CMOS solid-state imaging apparatus 51 is employed, and a digital signal processor (DSP) circuit 303 that is a camera signal processing circuit. The imaging apparatus 300 further includes a frame memory 304, a display unit 305, a recording unit 306, an operation unit 307, and a power-supply unit 308. The DSP circuit 303, the frame memory 304, the display unit 305, the recording unit 306, the operation unit 307, and the power-supply unit 308 are connected to one another via a bus line 309.

The optical unit 301 receives incident light (image light) from a subject and forms an image on an imaging surface of the solid-state imaging apparatus 302. The solid-state imaging apparatus 302 converts an amount of incident light of the image that have been formed on the imaging surface by the optical unit 301 into an electrical signal for each pixel and outputs the electrical signal as a pixel signal. The above-mentioned CCD solid-state imaging apparatus 1 or CMOS solid-state imaging apparatus 51, that is, a solid-state imaging apparatus having improved charge transfer efficiency can be used as the solid-state imaging apparatus 302.

The display unit 305 includes, for example, a panel-type display apparatus such as a liquid-crystal panel and an organic electro luminescence (EL) panel and displays moving images or still images captured by the solid-state imaging apparatus 302. The recording unit 306 records the moving images or still images captured by the solid-state imaging apparatus 302 on a recording medium such as a hard disc and a semiconductor memory.

The operation unit 307 issues operation instructions about various functions of the imaging apparatus 300 according to operations made by a user. The power-supply unit 308 appropriately supplies various powers to be an operational power supply for the DSP circuit 303, the frame memory 304, the display unit 305, the recording unit 306, and the operation unit 307 to these supplied targets.

As described above, by using the above-mentioned CCD solid-state imaging apparatus 1 or CMOS solid-state imaging apparatus 51 as the solid-state imaging apparatus 302, it is possible to improve the charge transfer efficiency. Thus, it is possible to achieve a high-quality captured image also in the imaging apparatus 300 such as a video camera, a digital still camera, and a camera module for a mobile apparatus such as a cellular phone.

Embodiments of the present disclosure are not limited to the above-mentioned embodiments and may be variously changed without departing from the present disclosure.

In the example above, the solid-state imaging apparatus setting the first conductive type to the P-type, the second conductive type to the N-type and using electrons as the signal charges has been described. However, the technique of the present disclosure is applicable also to a solid-state imaging apparatus using a positive hole for the signal charges. Thus, the first conductive type may be set to the N-type and the second conductive type may be set to the P-type such that the above-mentioned semiconductor areas can be configured by inversed conductive-type semiconductor areas.

Further, the technique of the present disclosure is not limited to be applied to the solid-state imaging apparatus that detects a distribution of amounts of incident visible light and captures it as an image. The technique of the present disclosure is also applicable to a solid-state imaging apparatus that captures a distribution of amounts of incident infrared light, X ray, particles, or the like and to general solid-state imaging apparatuses (physical amount distribution detecting apparatus) such as a fingerprint detection sensor that detects a distribution of other physical amounts including a pressure, a capacitance, and the like in the broad sense.

Note that the present disclosure may also take the following configurations.

(1) A solid-state imaging apparatus, including
a semiconductor substrate in which a charge transfer section configured to transfer a charge generated in a photoelectric conversion section is formed, the semiconductor substrate including a surface that is formed in a convex shape in an area in which the charge transfer section is formed.

(2) The solid-state imaging apparatus according to (1), in which
the surface of the semiconductor substrate is formed in a convex shape in an boundary area of the charge transfer section in a transfer direction of the charge.

(3) The solid-state imaging apparatus according to (1) or (2), in which
the charge transfer section is a vertical charge coupled device (CCD) configured to transfer the charge in a vertical direction.

(4) The solid-state imaging apparatus according to any one of (1) to (3), in which
the charge transfer section is a read-out section configured to read out the charge of the photoelectric conversion section.

(5) The solid-state imaging apparatus according to (1) or (2), in which
the charge transfer section is a charge accumulation section configured to temporarily retain the charge generated in the photoelectric conversion section until the charge is read out.

(6) A method of manufacturing a solid-state imaging apparatus, including:
forming a surface of a semiconductor substrate in a convex shape by a LOCOS (local oxidation of silicon) method; and
subjecting a resist mask to patterning and performing an ion implantation such that a boundary of the resist mask corresponds to a top of the convex shape, to thereby form a charge transfer section in the semiconductor substrate.

(7) The method of manufacturing a solid-state imaging apparatus according to (6), further including
making the convex shape of the semiconductor substrate flat after the charge transfer section is formed.

(8) An electronic apparatus, including
a solid-state imaging apparatus, including
a semiconductor substrate in which a charge transfer section configured to transfer a charge generated in a photoelectric conversion section is formed, the semiconductor substrate including a surface that is formed in a convex shape in an area in which the charge transfer section is formed.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus, comprising:
a semiconductor substrate including a semiconductor area of a first conductivity type, wherein the semiconductor area of the first conductivity type includes a first surface and a second surface, the first surface having convex-shaped portions including a first convex-shaped portion and a second convex-shaped portion; and
a charge transfer section of a second conductivity type located between the first surface and the second surface of the semiconductor area of the first conductivity type,
wherein,
the charge transfer section is configured to transfer a charge generated in a photoelectric conversion section, and
a first end portion of the charge transfer section is located below the first convex-shaped portion, and a second end portion of the charge transfer section is located below the second convex-shaped portion.

2. The imaging apparatus according to claim 1, wherein the charge transfer section is a vertical charge coupled device (CCD) configured to transfer the charge in a vertical direction.

3. The imaging apparatus according to claim 1, wherein the charge transfer section is a read-out section configured to read out the charge of the photoelectric conversion section.

4. The imaging apparatus according to claim 1, wherein the charge transfer section is a charge accumulation section configured to temporarily retain the charge generated in the photoelectric conversion section until the charge is read out.

5. The imaging apparatus of claim 1, further comprising a channel section of the second conductivity type located between the first surface and the second surface of the semiconductor substrate, wherein the charge transfer section is located within the channel section.

6. The imaging apparatus of claim 1, wherein the photoelectric conversion section is located within the semiconductor area of the first conductivity type.

7. The imaging apparatus of claim 6, further comprising a film disposed on the convex-shaped portions of the first surface of the semiconductor substrate.

8. The imaging apparatus of claim 7, further comprising a gate electrode disposed on at least one convex-shaped portion of the first surface of the semiconductor substrate.

9. An electronic apparatus, comprising:
at least one lens configured to receive incident light; and
an imaging apparatus configured to receive the incident light from the at least one lens, the imaging apparatus including:
  a semiconductor substrate including a semiconductor area of a first conductivity type, wherein the semiconductor area of the first conductivity type includes a first surface and a second surface, the first surface having convex-shaped portions including a first convex-shaped portion and a second convex-shaped portion; and
  a charge transfer section of a second conductivity type located between the first surface and the second surface of the semiconductor area of the first conductivity type,
  wherein,
    the charge transfer section is configured to transfer a charge generated in a photoelectric conversion section, and
    a first end portion of the charge transfer section is located below the first convex-shaped portion, and a second end portion of the charge transfer section is located below the second convex-shaped portion.

10. The electronic apparatus according to claim 9, wherein the charge transfer section is a vertical charge coupled device (CCD) configured to transfer the charge in a vertical direction.

11. The electronic apparatus according to claim 9, wherein the charge transfer section is a read-out section configured to read out the charge of the photoelectric conversion section.

12. The electronic apparatus according to claim 9, wherein the charge transfer section is a charge accumulation section configured to temporarily retain the charge generated in the photoelectric conversion section until the charge is read out.

13. The electronic apparatus of claim 9, further comprising a channel section of the second conductivity type located between the first surface and the second surface of the semiconductor substrate, wherein the charge transfer section is located within the channel section.

14. The electronic apparatus of claim 9, wherein the photoelectric conversion section is located within the semiconductor area of the first conductivity type.

15. The electronic apparatus of claim 14, further comprising a film disposed on the convex-shaped portions of the first surface of the semiconductor substrate.

16. The electronic apparatus of claim 15, further comprising a gate electrode disposed on at least one convex-shaped portion of the first surface of the semiconductor substrate.

* * * * *